US012033989B2

(12) United States Patent
Choi et al.

(10) Patent No.: US 12,033,989 B2
(45) Date of Patent: *Jul. 9, 2024

(54) DISPLAY DEVICE USING SEMICONDUCTOR LIGHT EMITTING DEVICE AND METHOD FOR MANUFACTURING THE SAME

(71) Applicant: LG ELECTRONICS INC., Seoul (KR)

(72) Inventors: Juchan Choi, Seoul (KR); Changseo Park, Seoul (KR); Bongchu Shim, Seoul (KR); Kiseong Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 261 days.

This patent is subject to a terminal disclaimer.

(21) Appl. No.: 17/558,309

(22) Filed: Dec. 21, 2021

(65) Prior Publication Data

US 2022/0115361 A1    Apr. 14, 2022

Related U.S. Application Data

(63) Continuation of application No. 16/598,741, filed on Oct. 10, 2019, now Pat. No. 11,239,215.

(30) Foreign Application Priority Data

Dec. 21, 2018   (KR) ........................ 10-2018-0167608

(51) Int. Cl.
*H01L 25/075*   (2006.01)
*H01L 25/16*    (2023.01)
(52) U.S. Cl.
CPC ........ *H01L 25/0753* (2013.01); *H01L 25/167* (2013.01); *H01L 2224/95085* (2013.01)

(58) Field of Classification Search
CPC . H01L 25/0753; H01L 25/167; H10K 59/131; G09G 3/32; G09G 3/3208
See application file for complete search history.

(56) References Cited

U.S. PATENT DOCUMENTS 6,731,353 B1   5/2004   Credelle et al.
9,825,202 B2   11/2017  Schuele et al.
(Continued)

FOREIGN PATENT DOCUMENTS

CN   106575688 A     4/2017
JP   2013-251224 A   12/2013
(Continued)

OTHER PUBLICATIONS

Tkachenko et al., "Evaluation of Directed Self-Assembly Process for LED Assembly on Flexible Substrates", 2013 Electronic Components & Technology Conference, 2013, pp. 546-552, 7 pages total.

*Primary Examiner* — Jose R Diaz
(74) *Attorney, Agent, or Firm* — Birch, Stewart, Kolasch & Birch, LLP

(57) ABSTRACT

Discussed is a display device, including a substrate having an assembly region and a non-assembly region, semiconductor light emitting devices arranged on the substrate, a first wiring electrode and a second wiring electrode extended from each of the semiconductor light emitting devices, respectively, to supply an electric signal to the semiconductor light emitting devices, pair electrodes arranged on the substrate to generate an electric field when an electric current is supplied, and provided with first and second pair electrodes disposed on an opposite side to the first and second wiring electrodes with respect to the semiconductor light emitting devices, a dielectric layer disposed on the pair electrodes, and bus electrodes electrically connected to the pair electrodes, wherein the pair electrodes are arranged in (Continued)

parallel to each other along a direction in the assembly region, and wherein the bus electrodes are disposed in the non-assembly region.

20 Claims, 18 Drawing Sheets

(56) References Cited

U.S. PATENT DOCUMENTS

| | | |
|---|---|---|
| 10,607,515 B2 | 3/2020 | Park et al. |
| 2011/0197429 A1 | 8/2011 | Ravindra |
| 2016/0099383 A1 | 4/2016 | Yuh |
| 2016/0148911 A1 | 5/2016 | Do |
| 2018/0053742 A1* | 2/2018 | Ting .................. H01L 24/81 |
| 2018/0175104 A1 | 6/2018 | Kang et al. |

FOREIGN PATENT DOCUMENTS

| | | |
|---|---|---|
| KR | 10-2005-0111897 A | 11/2005 |
| KR | 10-2018-0011286 A | 1/2018 |
| KR | 10-2018-0082003 A | 7/2018 |
| KR | 10-2018-0089771 A | 8/2018 |
| WO | WO 2015/005655 A1 | 1/2015 |
| WO | WO 2016/186376 A1 | 11/2016 |

* cited by examiner

DISPLAY DEVICE USING SEMICONDUCTOR LIGHT EMITTING DEVICE AND METHOD FOR MANUFACTURING THE SAME

CROSS-REFERENCE TO RELATED APPLICATION

This application is a Continuation of U.S. patent application Ser. No. 16/598,741 filed on Oct. 10, 2019 (now U.S. Pat. No. 11,239,215, issued on Feb. 1, 2022), which claims the benefit of the earlier filing date and the right of priority to Korean Application No. 10-2018-0167608, filed on Dec. 21, 2018, the entire contents of all these applications are hereby expressly incorporated by reference into the present application.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, liquid crystal displays (LCDs), organic light emitting diode (OLED) displays, and micro LED displays have been competing to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting devices (micro LED (μLED)) having a diameter or a cross sectional area of 100 microns or less are used in a display, the display can provide a very high efficiency because it does not absorb light using a polarizing plate or the like. However, since a large-sized display requires millions of semiconductor light emitting devices, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting device locates themselves in a fluid, is the most advantageous method for realizing a large-sized display device.

In recent years, U.S. Pat. No. 9,825,202 proposed a micro LED structure suitable for self-assembly, but there is not yet research on technologies for fabricating a display through self-assembly of micro LEDs. Accordingly, the present disclosure proposes a new type of display device in which micro LEDs can be self-assembled and a fabrication method thereof.

SUMMARY OF THE INVENTION

An object of the present disclosure is to provide a new fabrication process with high reliability in a large-screen display using micro-sized semiconductor light emitting devices.

Another object of the present disclosure is to provide a fabrication process of a display in which semiconductor light emitting devices can be self-assembled directly on a wiring substrate.

Still another object of the present disclosure is to provide a display fabrication process capable of reducing a fabrication time of a large-screen display.

In order to achieve the foregoing objectives, the present disclosure can provide a display device, including a substrate, a plurality of semiconductor light emitting devices arranged on the substrate, a first wiring electrode and a second wiring electrode extended from the semiconductor light emitting devices, respectively, to supply an electric signal to the semiconductor light emitting devices, a plurality of pair electrodes arranged on the substrate to generate an electric field when an electric current is supplied, and provided with first and second pair electrodes formed on an opposite side to the first and second wiring electrodes with respect to the semiconductor light emitting devices, and a dielectric layer formed to cover the plurality of pair electrodes, wherein the plurality of pair electrodes are arranged in parallel to each other along a direction.

According to an embodiment, each of the plurality of semiconductor light emitting devices can be disposed to overlap with any one of the pair electrodes.

According to an embodiment, the plurality of semiconductor light emitting devices can include a first semiconductor light emitting device that emits first color, and a second semiconductor light emitting device that emits second color different from the first color, wherein the first and second semiconductor light emitting devices are respectively disposed to overlap with pair electrodes different from each other.

According to an embodiment, a distance between the first and second electrodes can be smaller than that between the pair electrodes.

According to an embodiment, a width of each of the pair electrodes can be larger than that of the semiconductor light emitting device.

According to an embodiment, the display device can further include a thin film transistor disposed on the substrate, and electrically connected to the semiconductor light emitting device.

According to an embodiment, the pair electrode and the thin film transistor can be disposed on the same plane of the substrate.

In addition, the present disclosure can provide a self-assembly method of a semiconductor light emitting device, and the method can include providing a substrate having an assembly region and a non-assembly region to an assembly position providing semiconductor light emitting devices into a fluid chamber, applying a magnetic force to the semiconductor light emitting devices to move the semiconductor light emitting devices along a direction in the fluid chamber, and applying a voltage to a plurality of pair electrodes arranged on the substrate to guide the semiconductor light emitting devices to preset positions so as to allow the semiconductor light emitting devices to be placed at the preset positions of the assembly region during the movement of the semiconductor light emitting devices, wherein the plurality of pair electrodes are arranged on the assembly region of the substrate, and bus electrodes electrically connected to the plurality of pair electrodes are disposed in the non-assembly region.

According to an embodiment, said applying a voltage to a plurality of pair electrodes arranged on the substrate can apply a voltage to the plurality of pair electrodes through an external power source connected to the bus electrodes.

According to an embodiment, a first bus electrode and a second bus electrode can disposed on the substrate, and part of the pair electrodes can be electrically connected to the first bus electrode and another part of the pair electrodes can be electrically connected to the second bus electrode.

According to an embodiment, said applying a magnetic force to the semiconductor light emitting devices and said guiding the semiconductor light emitting devices to the preset positions can be carried out at least once while the semiconductor light emitting devices that emits first color is put into the fluid chamber, and carried out at least once while the semiconductor light emitting devices that emits second color different from the first color is put into the fluid chamber.

According to an embodiment, said guiding the semiconductor light emitting devices to the preset positions can apply a voltage to different pair electrodes for each type of the semiconductor light emitting devices being put into the fluid chamber to guide the semiconductor light emitting devices to different pair electrodes depending on the type of the semiconductor light emitting devices.

According to an embodiment, the substrate can include a plurality of assembly regions, and pair electrodes arranged in each of the plurality of assembly regions can be electrically connected to the same bus electrode.

According to an embodiment, the present disclosure can further include dividing the substrate for each assembly region.

According to the present disclosure having the foregoing configuration, a large number of semiconductor light emitting devices can be assembled at one time in a display device in which individual pixels are formed with micro light emitting diodes.

As described above, according to the present disclosure, a large number of semiconductor light emitting devices can be pixelated on a wafer having a small size, and then directly transferred onto a large-area substrate. Furthermore, as the mesa of the semiconductor light emitting devices is carried out on a substrate, it is possible to directly transfer the semiconductor light emitting devices to a wiring substrate without using a temporary substrate. Through this, it is possible to fabricate a large-area display device at a low cost.

In addition, according to the fabrication method and device of the present disclosure, semiconductor light emitting devices can be simultaneously transferred to exact positions using a magnetic field and an electric field in a solution, thereby allowing a low cost, high efficiency, and high-speed transfer implementation.

In addition, since assembly by an electric field is carried out, selective assembly is allowed through a selective electrical application without any additional device or process. Accordingly, red, green, and blue micro LEDs can be selectively assembled at desired positions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
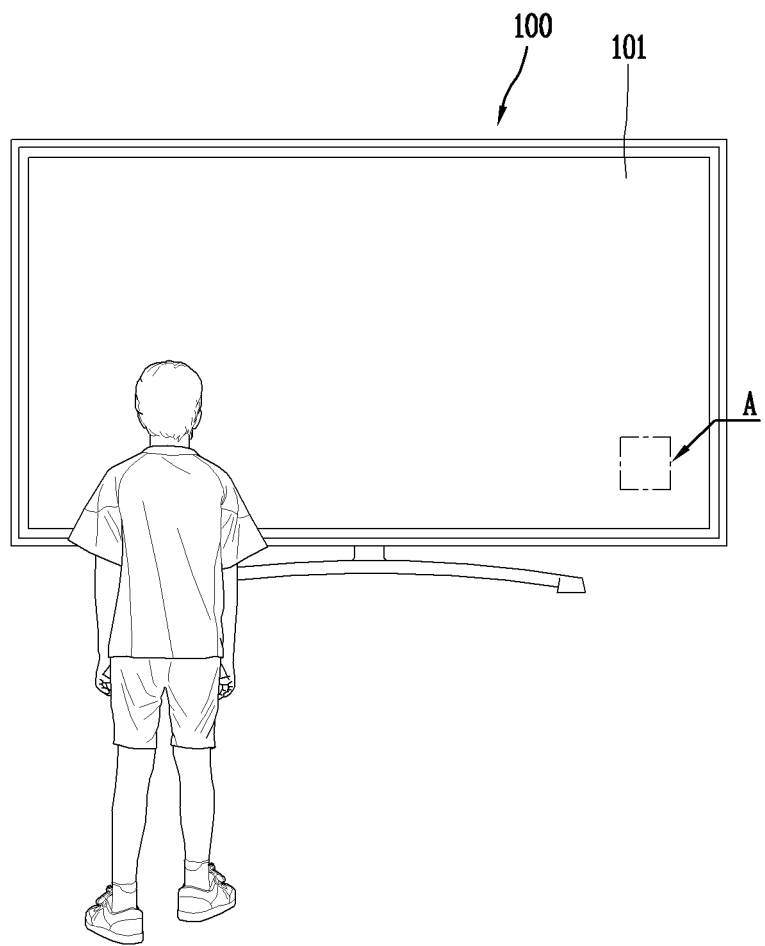
FIG. 1 is a view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element can also be interposed therebetween.

A display device disclosed herein can include a portable phone, a smart phone, a laptop computer, a digital broadcast terminal, a personal digital assistant (PDA), a portable multimedia player (PMP), a navigation, a slate PC, a tablet PC, an ultrabook, a digital TV, a digital signage, a head-mounted display (HMD), a desktop computer, and the like. However, it would be easily understood by those skilled in the art that a configuration disclosed herein can be applicable to any displayable device even though it is a new product type which will be developed later.

Figure 2:
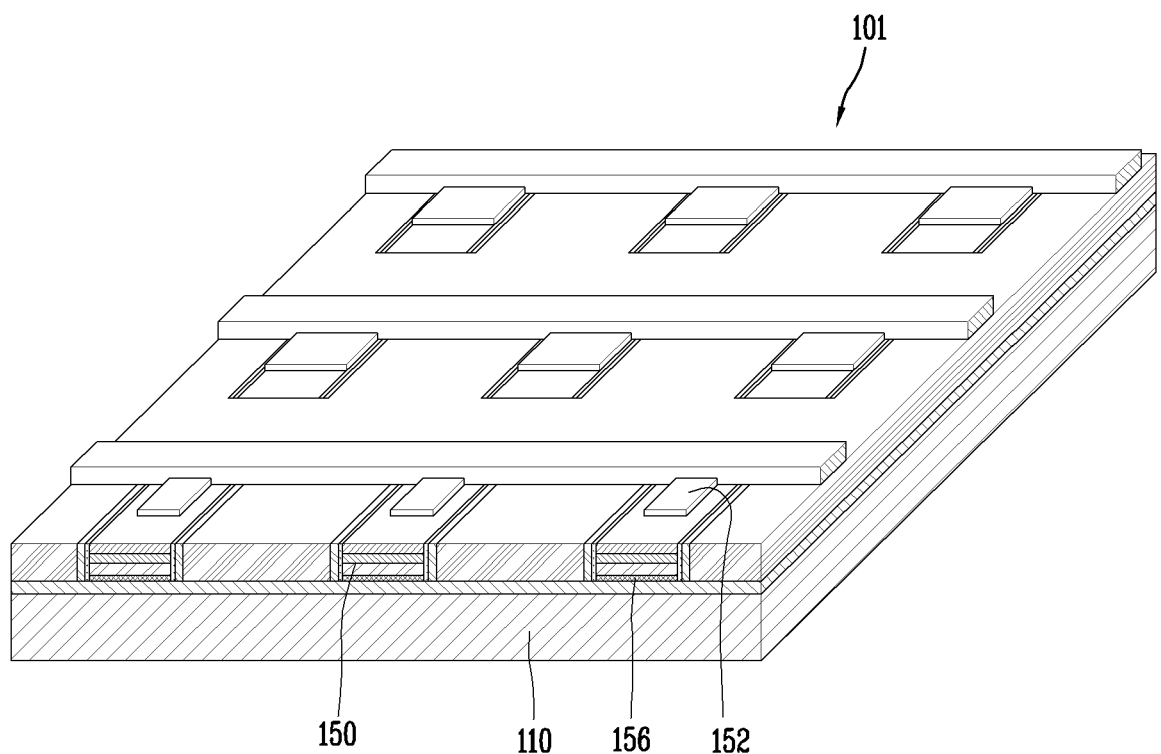
FIG. 2 is a partially enlarged view showing a portion "A" of the display device in FIG. 1.
Figure 3:
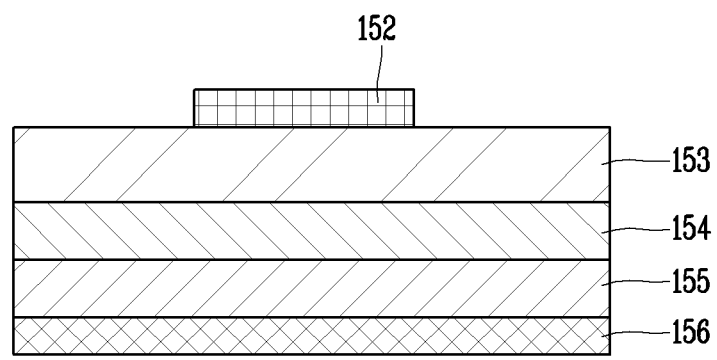
FIG. 3 is an enlarged view showing a semiconductor light emitting device in FIG. 2.
Figure 4:
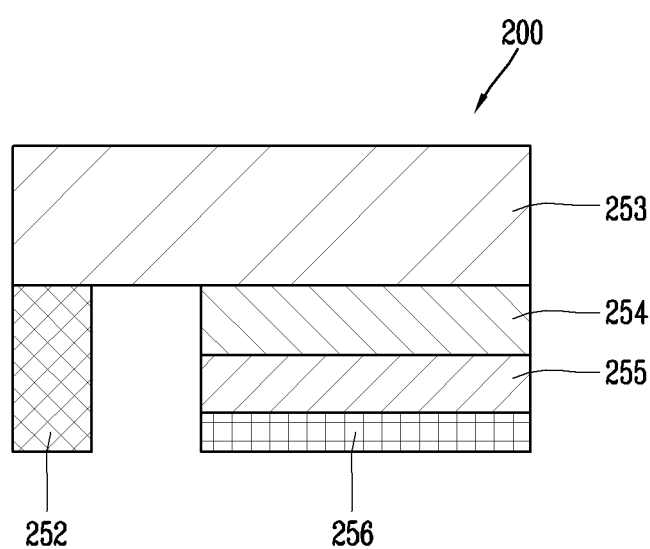
FIG. 4 is an enlarged view showing another embodiment of the semiconductor light emitting device in FIG. 2.

FIG. 1 is a view showing a display device using a semiconductor light emitting device according to an embodiment of the present disclosure, and FIG. 2 is a partially enlarged view showing a portion "A" of the display device in FIG. 1, and FIG. 3 is an enlarged view showing a semiconductor light emitting device in FIG. 2, and FIG. 4 is an enlarged view showing another embodiment of the semiconductor light emitting device in FIG. 2.

According to the illustration, information processed in the controller of the display device 100 can be displayed on a display module 140. A case 101 in the form of a closed loop surrounding an edge of the display module can form a bezel of the display device.

The display module 140 can include a panel 141 on which an image is displayed, and the panel 141 can include micro-sized semiconductor light emitting devices 150 and a wiring substrate 110 on which the semiconductor light emitting devices 150 are mounted.

Wiring lines can be formed on the wiring substrate 110, and connected to an n-type electrode 152 and a p-type electrode 156 of the semiconductor light emitting device 150. Through this, the semiconductor light emitting device 150 can be provided on the wiring substrate 110 as a self-emitting individual pixel.

An image displayed on the panel 141 is visual information, and implemented by independently controlling the light emission of a sub-pixel arranged in a matrix form through the wiring lines.

According to the present invention, a micro LED (Light Emitting Diode) is illustrated as one type of the semiconductor light emitting device 150 that converts current into light. The micro LED can be a light emitting diode formed with a small size of 100 microns or less. The semiconductor light emitting device 150 can be provided in blue, red, and green light emitting regions, respectively, to implement a sub-pixel by a combination of the light emitting regions. In other words, the sub-pixel denotes a minimum unit for implementing a single color, and at least three micro LEDs can be provided in the sub-pixel.

More specifically, referring to FIG. 3, the semiconductor light emitting device 150 can be a vertical structure.

For example, the semiconductor light emitting devices 150 can be implemented with a high-power light emitting device that emits various lights including blue in which gallium nitride (GaN) is mostly used, and indium (In) and or aluminum (Al) are added thereto.

The vertical semiconductor light emitting device can include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom can be electrically connected to a p-electrode of the wiring substrate, and the n-type electrode 152 located at the top can be electrically connected to an n-electrode at an upper side of the semiconductor light emitting device. The electrodes can be disposed in the upward/downward direction in the vertical semiconductor light emitting device 150, thereby providing a great advantage capable of reducing the chip size.

For another example, referring to FIG. 4, the semiconductor light emitting device can be a flip chip type semiconductor light emitting device.

For such an example, the semiconductor light emitting device 250 can include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 can be electrically connected to the p-electrode and the n-electrode of the wiring substrate at the bottom of the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. The green semiconductor light emitting device and the blue semiconductor light emitting device can be mostly formed of gallium nitride (GaN), and indium (In) and/or aluminum (Al) can be added thereto to implement a high-power light emitting device that emits green or blue light. For such an example, the semiconductor light emitting device can be a gallium nitride thin-film formed in various layers such as n-Gan, p-Gan, AlGaN, and InGa, and specifically, the p-type semiconductor layer can be p-type GaN, and the n-type semiconductor layer can be N-type GaN. However, in case of the red semiconductor light emitting device, the p-type semiconductor layer can be p-type GaAs and the n-type semiconductor layer can be n-type GaAs.

In addition, a p-electrode side in the p-type semiconductor layer can be p-type GaN doped with Mg, and an n-electrode side in the n-type semiconductor layer can be n-type GaN doped with Si. In this case, the above-described semiconductor light emitting devices can be semiconductor light emitting devices without an active layer.

On the other hand, referring to FIGS. 1 through 4, since the light emitting diode is very small, the display panel can be arranged with self-emitting sub-pixels arranged at fine pitch, thereby implementing a high-quality display device.

In a display device using the semiconductor light emitting device of the present disclosure described above, a semiconductor light emitting device grown on a wafer and formed through mesa and isolation is used as an individual pixel. In this case, the micro-sized semiconductor light emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5A through 5E are views for explaining a new process of fabricating the foregoing semiconductor light emitting device.

In this specification, a display device using a passive matrix (PM) semiconductor light emitting device is illustrated. However, an example described below can also be applicable to an active matrix (AM) type semiconductor light emitting device. In addition, a method using a horizontal semiconductor light emitting device is illustrated, but it is also applicable to a method of self-assembling a vertical semiconductor light emitting device.

First, according to a manufacturing method, a first conductive semiconductor layer 253, an active layer 254, and a second conductive semiconductor layer 255 are respectively grown on a growth substrate 259.

Figure 5A:
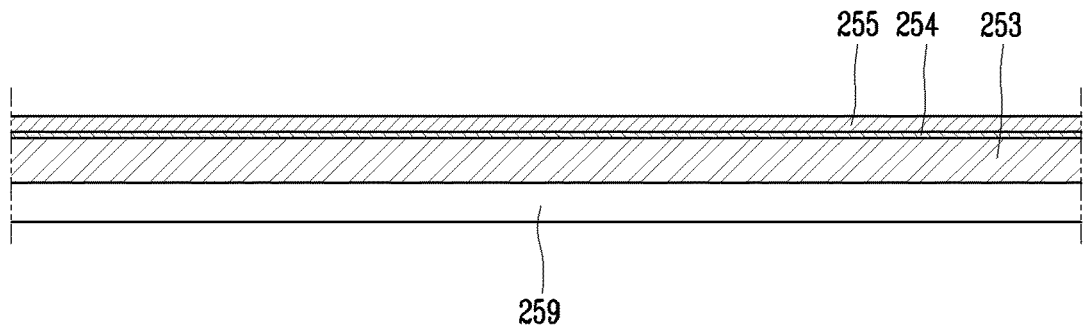
FIGS. 5A through 5E are views for explaining a new process of fabricating the foregoing semiconductor light emitting device.

When the first conductive semiconductor layer 253 is grown, next, the active layer 254 is grown on the first conductive semiconductor layer 253, and then the second conductive semiconductor layer 255 is grown on the active layer 1154. As described above, when the first conductive semiconductor layer 253, the active layer 254 and the second conductive semiconductor layer 255 are sequentially grown, the first conductive semiconductor layer 253, the active layer 254, and the second conductive semiconductor layer 255 form a layer structure as illustrated in FIG. 5A.

In this case, the first conductive semiconductor layer 253 can be an n-type semiconductor layer, and the second conductive semiconductor layer 255 can be a p-type semiconductor layer. However, the present disclosure is not limited thereto, and the first conductive type can be p-type and the second conductive type can be n-type.

In addition, the present embodiment illustrates a case where the active layer is present, but it is also possible to adopt a structure in which the active layer is not present as described above. For such an example, the p-type semiconductor layer can be p-type GaN doped with Mg, and an n-electrode side in the n-type semiconductor layer can be n-type GaN doped with Si.

The growth substrate 259 (wafer) can be formed of any one of materials having light transmission properties, for example, sapphire ($Al_2O_3$), GaN, ZnO, and AlO, but is not limited thereto. Furthermore, the growth substrate 259 can be formed of a carrier wafer, which is a material suitable for semiconductor material growth. The growth substrate (W) can be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ can be used.

Figure 5B:
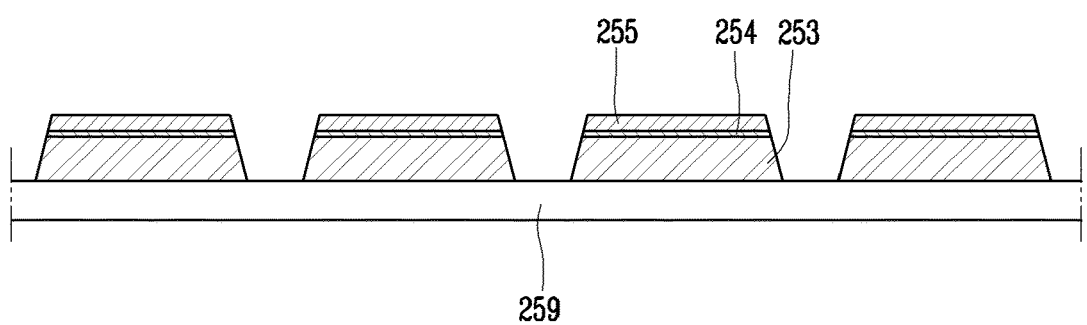

Next, at least part of the first conductive semiconductor layer 253, the active layer 254 and the second conductive semiconductor layer 255 is removed to form a plurality of epi chips of the semiconductor light emitting devices (FIG. 5B).

More specifically, isolation is carried out so that a plurality of light emitting devices form an array with epi chips. In other words, the first conductive semiconductor layer 253, the active layer 254, and the second conductive semiconductor layer 255 are etched in a vertical direction to form a plurality of semiconductor light emitting devices.

If the horizontal semiconductor light emitting device is formed at this stage, then the active layer 254 and the second conductive semiconductor layer 255 can be partially removed in a vertical direction to perform a mesa process in which the first conductive semiconductor layer 253 is exposed to the outside, and then isolation in which the first conductive semiconductor layer is etched to form a plurality of semiconductor light emitting device arrays. However, according to the present disclosure, since the mesa process is carried out subsequent to self-assembly, the isolation process is carried out without the mesa process in the present stage. In this case, the semiconductor light emitting device can be isolated to a circular size of 100 μm or less in diameter.

Figure 5C:
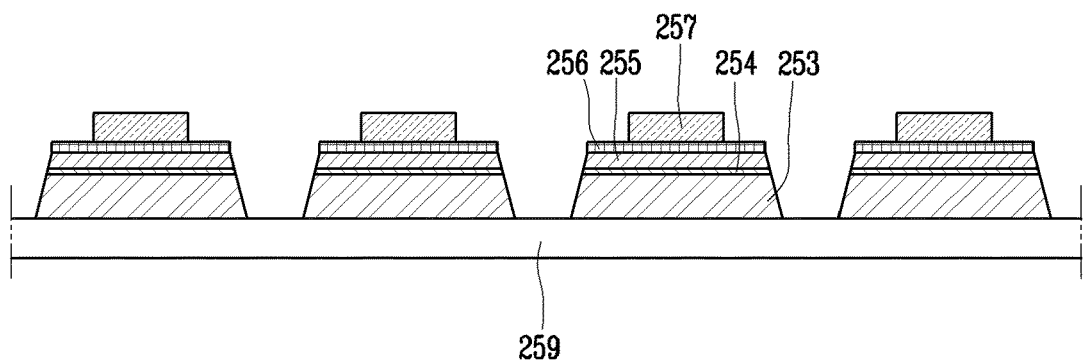

Next, a second conductive electrode 256 (or a p-type electrode) is formed on one surface of the second conductive semiconductor layer 255 (FIG. 5C). The second conductive electrode 256 can be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 256 can also be an n-type electrode.

Then, a magnetic body 257 is laminated on the second conductive electrode 256. The magnetic body 257 can refer to a metal having a magnetic property formed on an epi chip. The magnetic body can be Ni, Sn, Fe, Co or the like, and for another example, a material corresponding to at least one of Gd-based, La-based, and Mn-based materials.

The magnetic body 257 can serve as a post for upper and lower division at the time of self-assembly afterward, and can have an area of 25 to 75% of the area of the epi chip and a height of several hundred nanometers to several micrometers. However, the present disclosure is not limited thereto, and the magnetic body can be provided in the second conductive electrode 256 in the form of particles. Furthermore, alternatively, for a conductive electrode including a magnetic body, a single layer of the conductive electrode can be made of a magnetic body. For such an example, the second conductive electrode 256 can include a first layer on the inner side and a second layer on the outer side. Here, the first layer can be made to include a magnetic body, and the second layer can include a metal material other than a magnetic body.

Figure 5D:
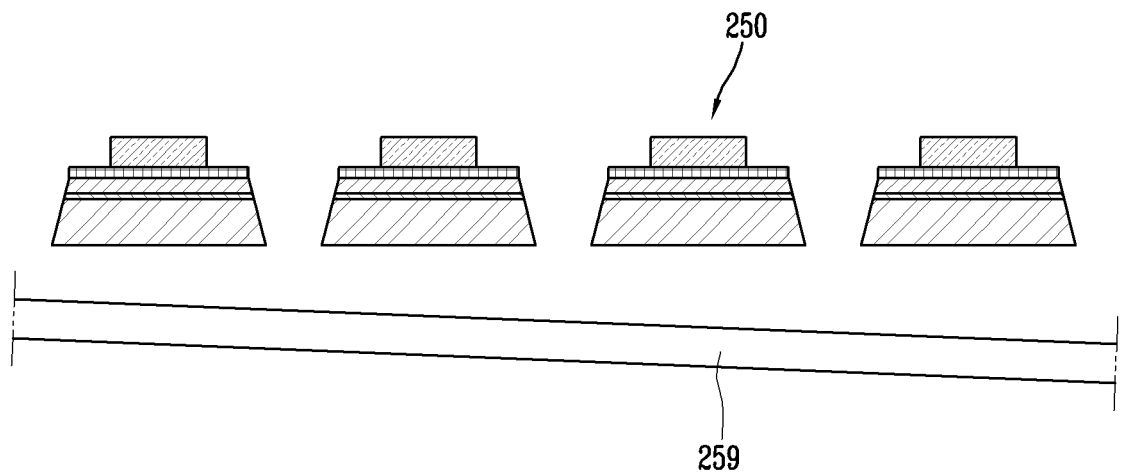

Then, the growth substrate 259 is removed to provide a plurality of semiconductor light emitting devices 250. For example, the growth substrate 259 can be removed using a laser lift-off (LLO) or chemical lift-off (CLO) method (FIG. 5D).

Figure 5E:
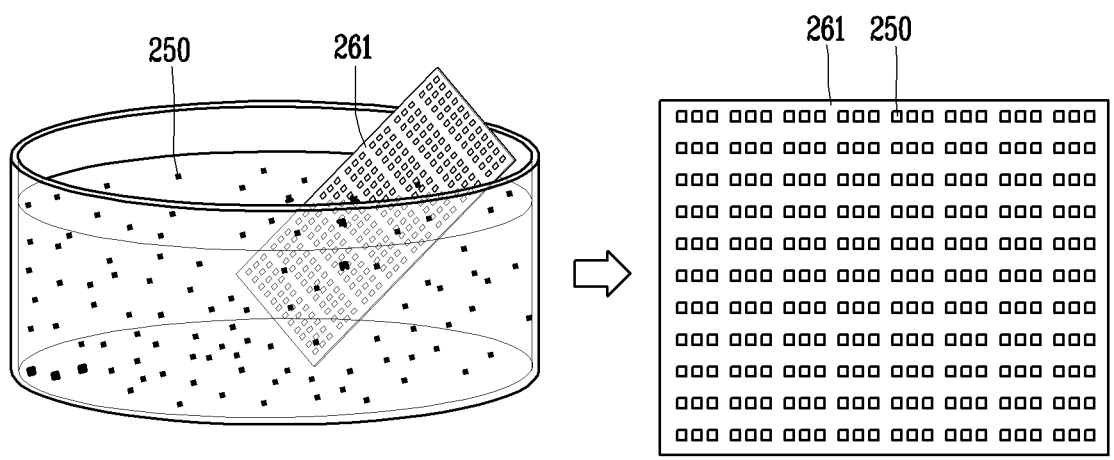

However, at this stage, the plurality of semiconductor light emitting devices 250 do not have a completed structure as an epi chip in a subsequent process. Then, the process of mounting the plurality of semiconductor light emitting devices 250 on the substrate in a chamber filled with a fluid (FIG. 5E).

For example, the semiconductor light emitting devices 250 and the substrate are placed in a chamber filled with a fluid, and the semiconductor light emitting devices 250 are assembled to the substrate by themselves using flow, gravity, surface tension, or the like.

In the present disclosure, the substrate can be a wiring substrate 261. In other words, the wiring substrate 261 is placed in the fluid chamber so that the semiconductor light emitting devices 250 are directly mounted on the wiring substrate 261.

Meanwhile, the self-assembly method described above must increase transfer yield when applied to the fabrication of a large-screen display. The present disclosure proposes a method and device for increasing transfer yield.

In this case, in a display device according to the present disclosure, a magnetic force is applied to the magnetic body in the semiconductor light emitting device to move the semiconductor light emitting device, and places the semiconductor light emitting device at preset positions using an electric field in the movement process. Hereinafter, such a transfer method and device will be described in more detail with reference to the accompanying drawings.

Figure 6:
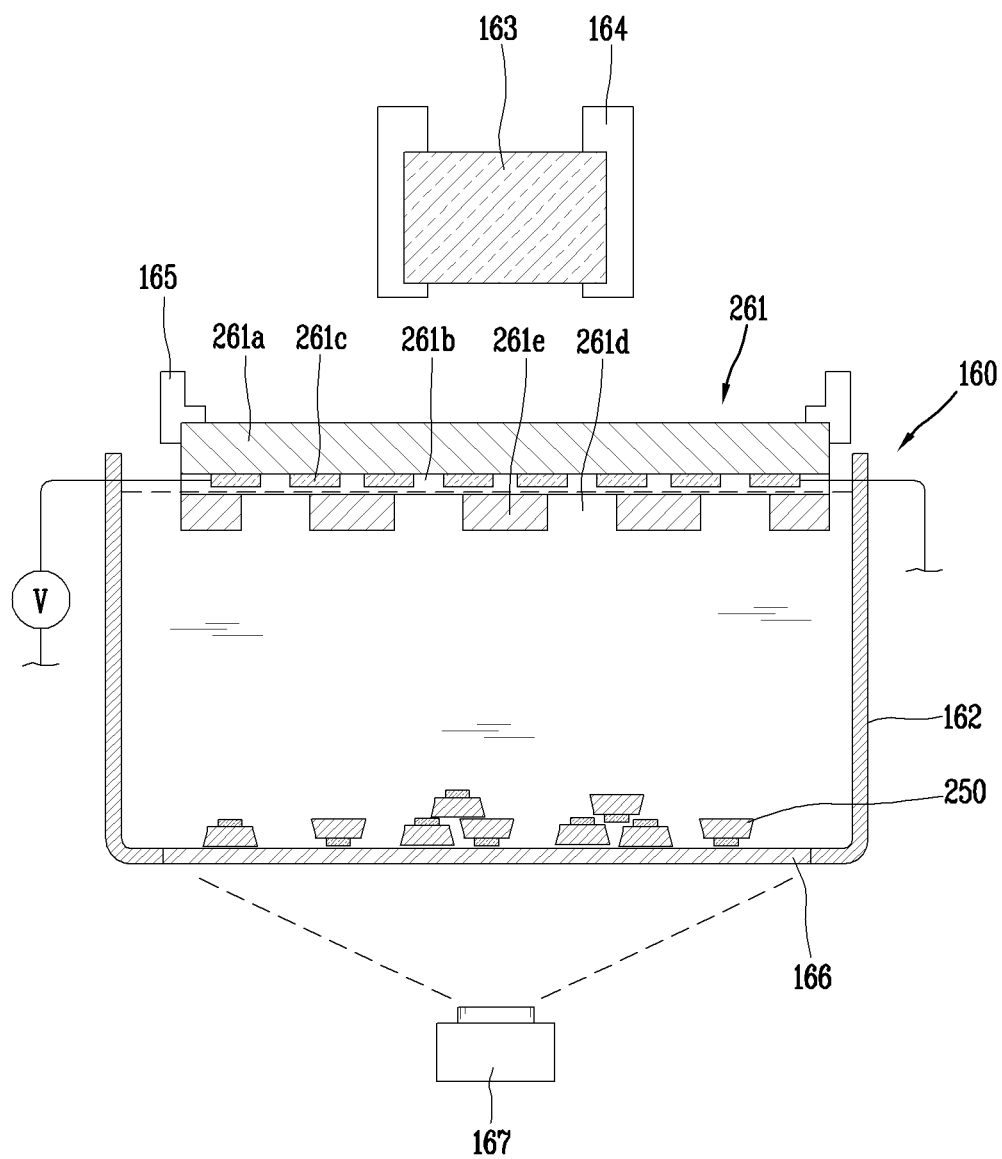
FIG. 6 is a view showing an example of a self-assembly device of semiconductor light emitting devices according to the present disclosure.
Figure 7:
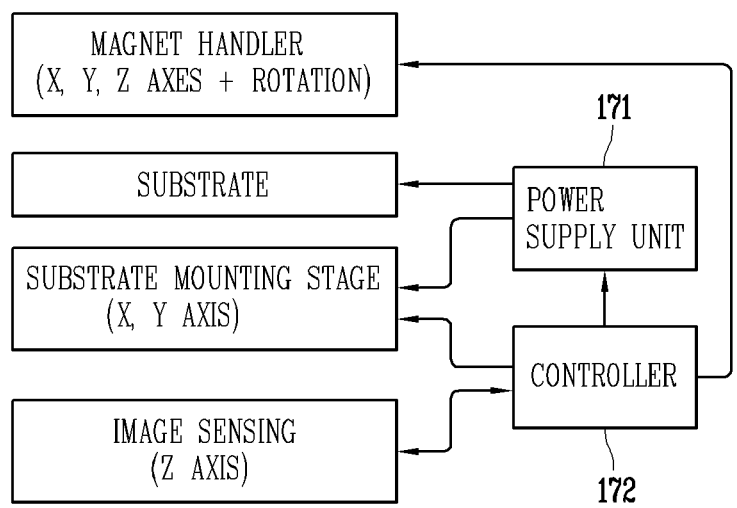
FIG. 7 is a block diagram showing the self-assembly device in FIG. 6.

FIG. 6 is a view showing an example of a self-assembly device of semiconductor light emitting devices according to the present invention, and FIG. 7 is a block diagram showing the self-assembly device in FIG. 6. Furthermore, FIGS. 8A through 8G are views showing a process of self-assembling semiconductor light emitting devices using the self-assembly device in FIG. 6.

According to the illustration of FIGS. 6 and 7, a self-assembly device 160 of the present disclosure can include a fluid chamber 162, a magnet 163, and a location controller 164.

The fluid chamber 162 has a space for accommodating a plurality of semiconductor light emitting devices. The space can be filled with a fluid, and the fluid can include water or the like as an assembly solution. Accordingly, the fluid chamber 162 can be a water tank, and can be configured with an open type. However, the present disclosure is not limited thereto, and the fluid chamber 162 can be a closed type in which the space is formed with a closed space.

The substrate 261 can be disposed on the fluid chamber 162 such that an assembly surface on which the semiconductor light emitting devices 250 are assembled faces downward. For example, the substrate 261 can be transferred to an assembly position by a transfer unit, and the transfer unit can include a stage 165 on which the substrate is mounted. The stage 165 is positioned by the controller, and the substrate 261 can be transferred to the assembly position through the stage 165.

At this time, the assembly surface of the substrate 261 faces the bottom of the fluid chamber 162 at the assembly position. According to the illustration, the assembly surface of the substrate 261 is disposed so as to be immersed in a fluid in the fluid chamber 162. Therefore, the semiconductor light emitting devices 250 are moved to the assembly surface in the fluid.

The substrate 261, which is an assembly substrate on which an electric field can be formed as well as a wiring substrate on which wiring lines are formed afterward, can include a base portion 261a, a dielectric layer 261b and a plurality of electrodes 261c, 261d.

The base portion 261a can be made of an insulating material, and the plurality of electrodes 261c can be a thin or a thick film bi-planar electrode patterned on one side of the base portion 261a. The electrode 261c can be formed of, for example, a laminate of Ti/Cu/Ti, an Ag paste, ITO, and the like.

More specifically, the electrode 261c can be a plurality of pair electrodes disposed on the substrate and provided with a first electrode 261c and a second electrode 261d that generate an electric field when an electric current is supplied.

The dielectric layer 261b is made of an inorganic material such as $SiO_2$, $SiN_x$, $SiON$, $Al_2O_3$, $TiO_2$, $HfO_2$, or the like. Alternatively, the dielectric layer 261b can be composed of a single layer or multiple layers as an organic insulator. A thickness of the dielectric layer 261b can be several tens of nanometers to several micrometers.

Furthermore, the wiring substrate 261 according to the present disclosure includes a plurality of cells 261d partitioned by partition walls.

For example, the wiring substrate 261 can be provided with cells 261d through which the semiconductor light emitting devices 250 are inserted so that the semiconductor light emitting devices 250 can easily be mounted on the wiring substrate 261 Specifically, cells 261d on which the semiconductor light emitting devices 250 are mounted are formed on the wiring substrate 261 at positions where the semiconductor light emitting devices 250 are aligned with the wiring electrodes. The semiconductor light emitting devices 250 are assembled into the cells 261d while moving in the fluid.

The cells 261d are sequentially arranged along a direction, and the partition walls 261e constituting the cells 261d are shared with the neighboring cells 261d. In this case, the partition walls 261e can be made of a polymer material. Furthermore, the partition walls 261e are protruded from the base portion 261a, and the cells 261d can be sequentially arranged along the a direction by the partition walls 261e. More specifically, the cells 261d are sequentially arranged in row and column directions, and can have a matrix structure.

As shown in the drawing, an inside of the cells 261d has a groove for accommodating the semiconductor light emitting device 250, and the groove can be a space defined by the partition walls 261e. The shape of the groove can be the same as or similar to that of the semiconductor light emitting device. For example, when the semiconductor light emitting device is in a rectangular shape, the groove can be a rectangular shape. In addition, although not shown, when the semiconductor light emitting device is circular, the grooves formed in the cells can be formed in a circular shape. Moreover, each of the cells is configured to accommodate a single semiconductor light emitting device. In other words, a single semiconductor light emitting device is accommodated in a single cell.

On the other hand, according to the present disclosure, a material same as that of the partition walls 261e can be filled inside the cells 261d by a subsequent process. Accordingly, the partition walls 261e can be modified into a passivation layer surrounding the semiconductor light emitting devices. This will be described later.

On the other hand, a plurality of electrodes can be disposed on the substrate, and have a first electrode and a second electrode that generate an electric field when an electric current is supplied, and the first electrode and the second electrode can be referred to as a pair electrode 261c. In the present disclosure, a plurality of the pair electrodes 261c can be provided, and disposed at the bottom of each of the cells 261d. The first electrode and the second electrode can be formed of electrode lines, and the plurality of electrode lines can be extended to neighboring cells.

The pair electrodes 261c are disposed below the cells 261d and applied with different polarities to generate an electric field in the cells 261d. In order to form the electric field, the dielectric layer can form the bottom of the cells 261d while the dielectric layer covers the pair electrodes 261c. In such a structure, when different polarities are applied to the pair electrode 261c from a lower side of each cell 261d, an electric field can be formed, and the semiconductor light emitting device can be inserted into the cells 261d by the electric field.

At the assembly position, the electrodes of the substrate 261 are electrically connected to the power supply unit 171. The power supply unit 171 applies power to the plurality of electrodes to generate the electric field.

According to the illustration, the self-assembly device can include a magnet 163 for applying a magnetic force to the semiconductor light emitting devices. The magnet 163 is spaced apart from the fluid chamber 162 to apply a magnetic force to the semiconductor light emitting devices 250. The magnet 163 can be disposed to face an opposite side of the assembly surface of the substrate 261, and the location of the magnet is controlled by the location controller 164 connected to the magnet 163. The semiconductor light emitting device 250 can have a magnetic body so as to move in the fluid by the magnetic field of the magnet 163.

Referring to FIGS. 6 and 7, more specifically, the self-assembly device can include a magnet handler that can be automatically or manually moved in the x, y, and z axes on the top of the fluid chamber or include a motor capable of rotating the magnet 163. The magnet handler and the motor can constitute the location controller 164. Through this, the magnet 163 rotates in a horizontal direction, a clockwise direction, or a counterclockwise direction with respect to the substrate 161.

On the other hand, a light transmitting bottom plate 166 can be formed in the fluid chamber 162, and the semiconductor light emitting devices can be disposed between the bottom plate 166 and the substrate 161. An image sensor 167 can be positioned to view the bottom plate 166 so as to monitor an inside of the fluid chamber 162 through the bottom plate 166. The image sensor 167 is controlled by the controller 172, and can include an inverted type lens, a CCD, and the like to observe the assembly surface of the substrate 261.

The self-assembling apparatus described above is configured to use a combination of a magnetic field and an electric field, and using those fields, the semiconductor light emitting devices can be placed at preset positions of the substrate by an electric field in the process of being moved by a location change of the magnet. Such a new fabrication method can be a detailed example of the self-assembly method described above with reference to FIG. 5E. Hereinafter, an assembly process using the self-assembly device described above will be described in more detail.

First, a plurality of semiconductor light emitting devices 250 having magnetic bodies are formed through the process described with reference to FIGS. 5A through 5D. In this case, a magnetic body can be deposited on the semiconductor light emitting device in the process of forming the second conductive electrode in FIG. 5C.

Figure 8A:
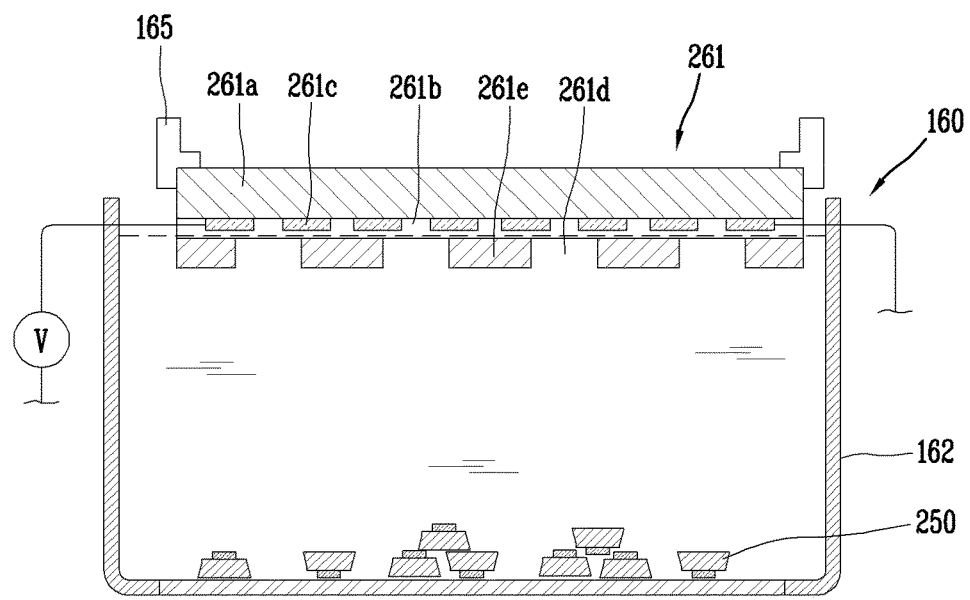
FIGS. 8A through 8G are views showing a process of self-assembling semiconductor light emitting devices using the self-assembly device in FIG. 6.

Next, the substrate 261 is transferred to the assembly position, and the semiconductor light emitting devices 250 are put into the fluid chamber 162 (FIG. 8A).

As described above, the assembly position of the substrate 261 is a position at which the assembly surface on which the semiconductor light emitting devices 250 of the substrate 261 are assembled is disposed in a downward direction in the fluid chamber 162.

In this case, some of the semiconductor light emitting devices 250 can sink to the bottom of the fluid chamber 162 and some can float in the fluid. When the light transmitting bottom plate 166 is provided in the fluid chamber 162, some of the semiconductor light-emitting devices 250 can sink to the bottom plate 166.

Figure 8B:
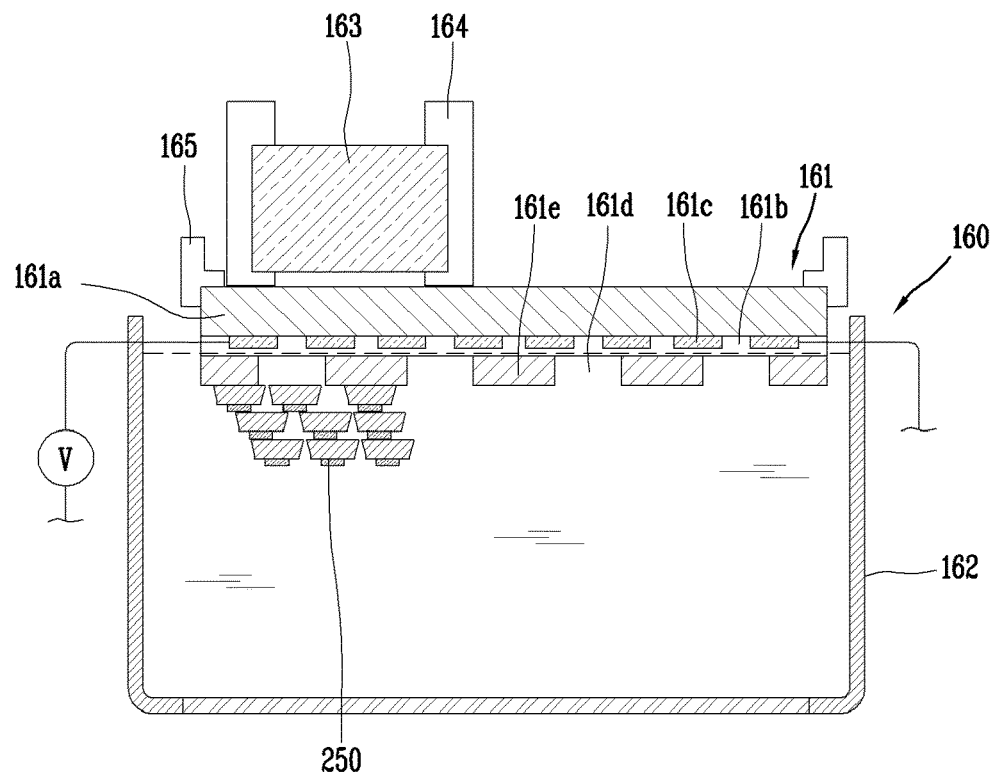

Next, a magnetic force is applied to the semiconductor light emitting devices 250 so that the semiconductor light emitting devices 250 float in the fluid chamber 162 in a vertical direction (FIG. 8B).

When the magnet 163 of the self-assembly device moves from its original position to an opposite side of the assembly surface of the substrate 261, the semiconductor light emitting devices 250 float in the fluid toward the substrate 261. The original position can be a position away from the fluid chamber 162. For another example, the magnet 163 can be composed of an electromagnet. In this case, electricity is supplied to the electromagnet to generate an initial magnetic force.

Meanwhile, in this example, a separation distance between the assembly surface of the substrate 261 and the semiconductor light emitting devices 250 can be controlled by adjusting the magnitude of the magnetic force. For example, the separation distance is controlled using the weight, buoyancy, and magnetic force of the semiconductor light emitting devices 250. The separation distance can be several millimeters to tens of micrometers from the outermost edge of the substrate.

Figure 8C:
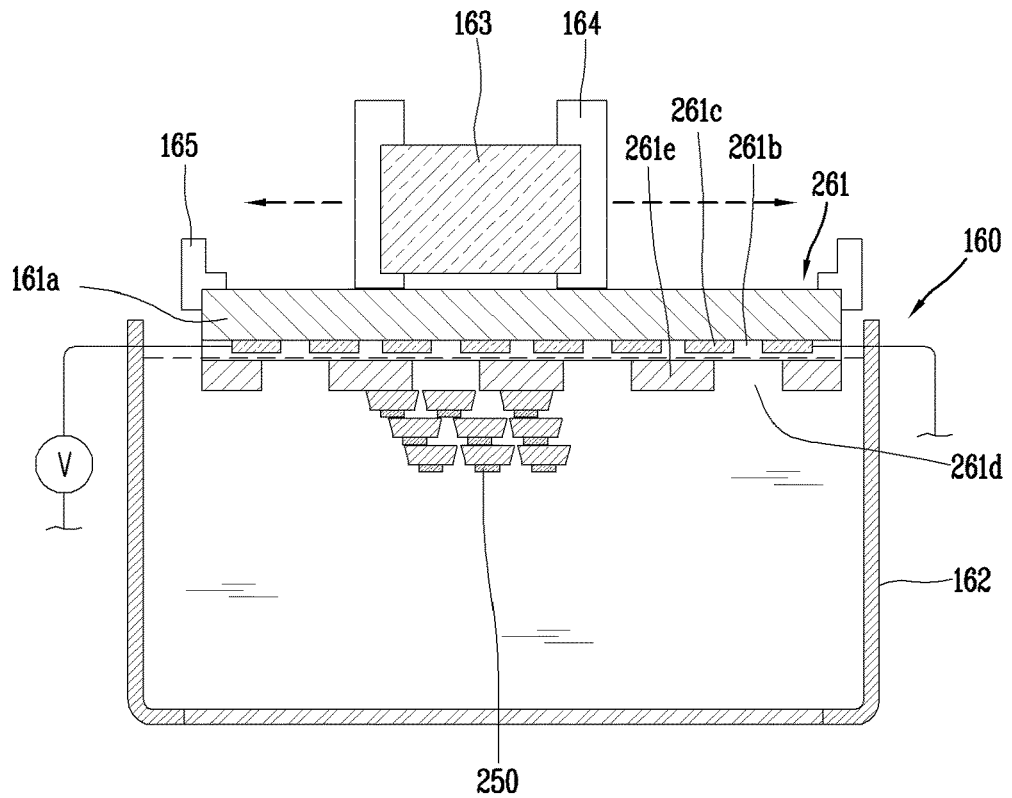

Next, a magnetic force is applied to the semiconductor light emitting devices 250 so that the semiconductor light emitting devices 250 move in a direction (one direction) in the fluid chamber 162. For example, the magnet 163 moves in a horizontal direction, a clockwise direction or a counterclockwise direction with respect to the substrate (FIG. 8C). In this case, the semiconductor light emitting devices 250 move in a direction parallel to the substrate 161 at a position spaced apart from the substrate 161 by the magnetic force.

Figure 8D:
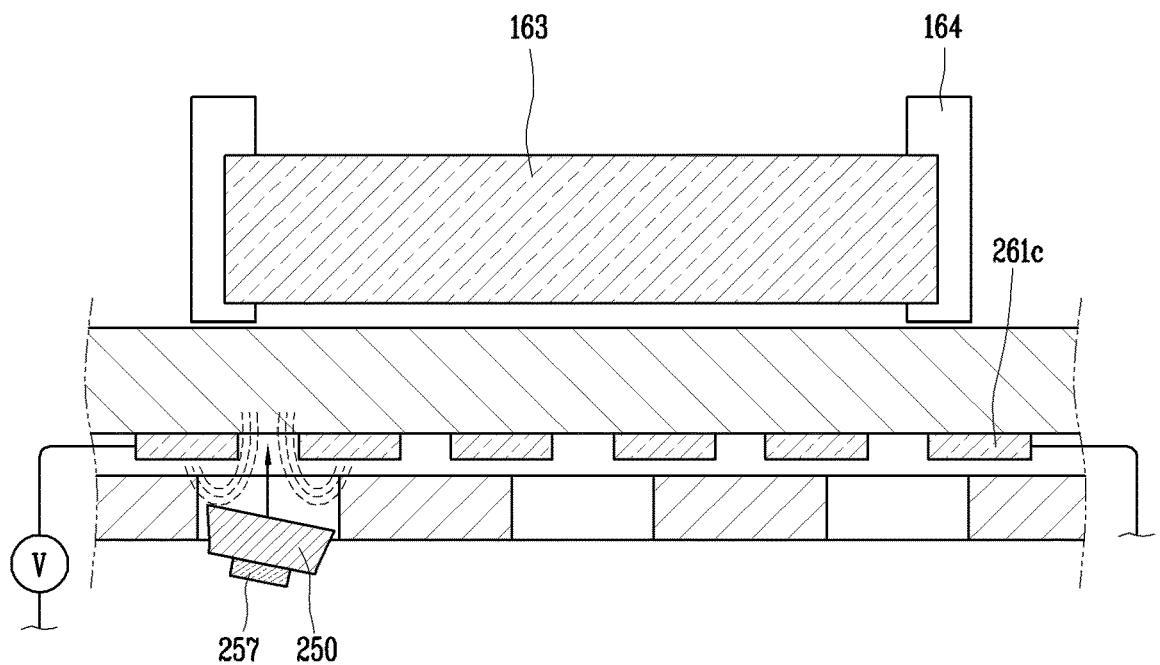

Next, the process of applying an electric field to guide the semiconductor light emitting devices 250 to preset positions of the substrate 161 so as to allow the semiconductor light emitting devices 250 to be placed at the preset positions during the movement of the semiconductor light emitting devices 250 is carried out (FIG. 8D). The semiconductor light emitting devices 250 move in a direction perpendicular to the substrate 261 by the electric field to be placed on preset positions while moving along a direction parallel to the substrate 161.

The plurality of semiconductor light emitting devices are guided to preset positions of the substrate by an electric field and a magnetic field.

More specifically, electric power is supplied to a pair electrode, that is, a bi-planar electrode of the substrate 261 to generate an electric field, and assembly is carried out only at preset positions. In other words, the semiconductor light emitting devices 250 are assembled to the assembly position of the substrate 261 using a selectively generated electric field. For this purpose, the substrate 261 can include cells in which the semiconductor light emitting devices 250 are inserted.

At this time, the magnetic body 257 of the semiconductor light emitting devices 250 serves as a post for upper and lower division. Specifically, when a surface having the magnetic body 257 is inserted into the cell in a direction toward the pair electrode 261c, the semiconductor light emitting device is unable to be placed on the bottom of the cell (an outer surface of the dielectric layer) by the magnetic body 257.

Figure 8E:
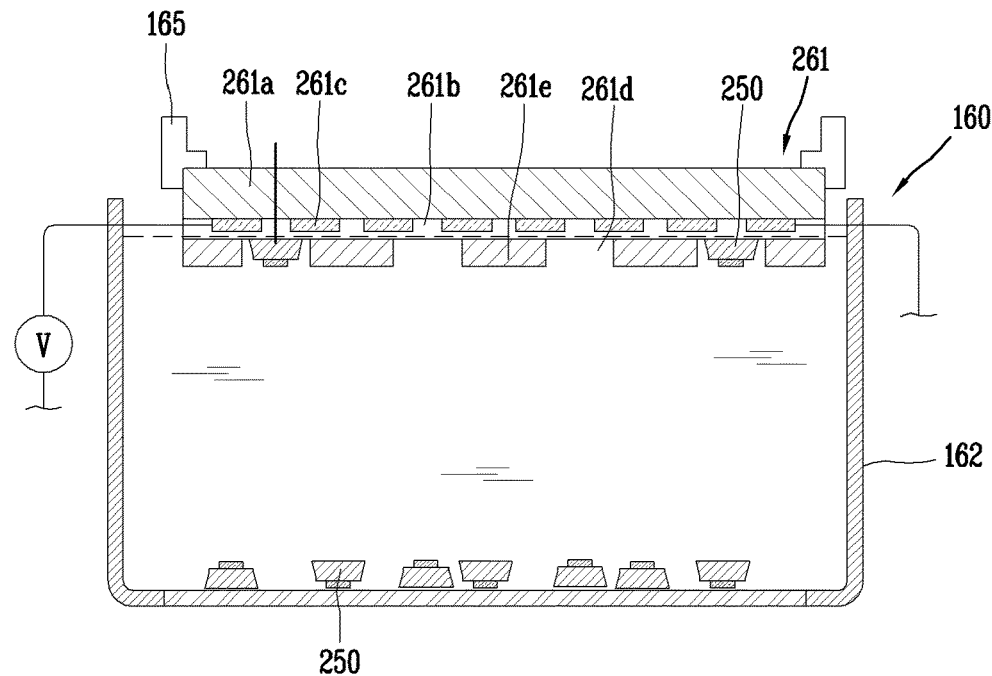

On the other hand, the semiconductor light emitting devices 250 can be guided to the preset positions, then the magnet 163 can move in a direction away from the substrate 261 such that the semiconductor light emitting devices 250 remaining in the fluid chambers 162 fall to the bottom of the fluid chambers 162, (FIG. 8E). For another example, if power supply is stopped when the magnet 163 is an electromagnet, then the semiconductor light emitting devices 250 remaining in the fluid chamber 162 fall to the bottom of the fluid chamber 162.

Then, when the semiconductor light emitting devices 250 on the bottom of the fluid chamber 162 are collected, the collected semiconductor light emitting devices 250 can be reused.

When the display device of the present disclosure uses blue semiconductor light emitting devices, that is, when the semiconductor light emitting devices are all blue semiconductor light emitting devices, the blue semiconductor light emitting devices can be assembled in all the cells of the substrate.

On the other hand, according to this example, each of the red semiconductor light emitting device, the green semiconductor light emitting device, and the blue semiconductor light emitting device can be arranged at a desired position. If the foregoing semiconductor light emitting device 250 is a blue semiconductor light emitting device, the assembly process described with reference to FIGS. 8A through 8E can generate an electric field only in a cell corresponding to a blue pixel to assemble the blue semiconductor light emitting device at a corresponding position.

Figure 8F:
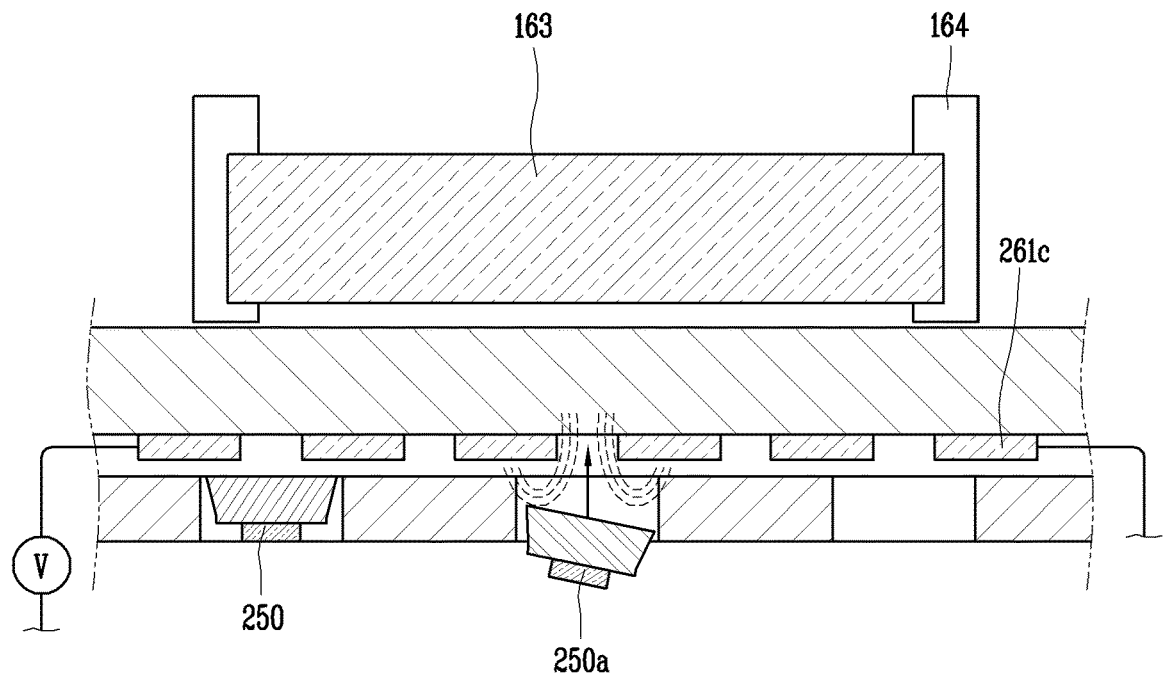
Figure 8G:
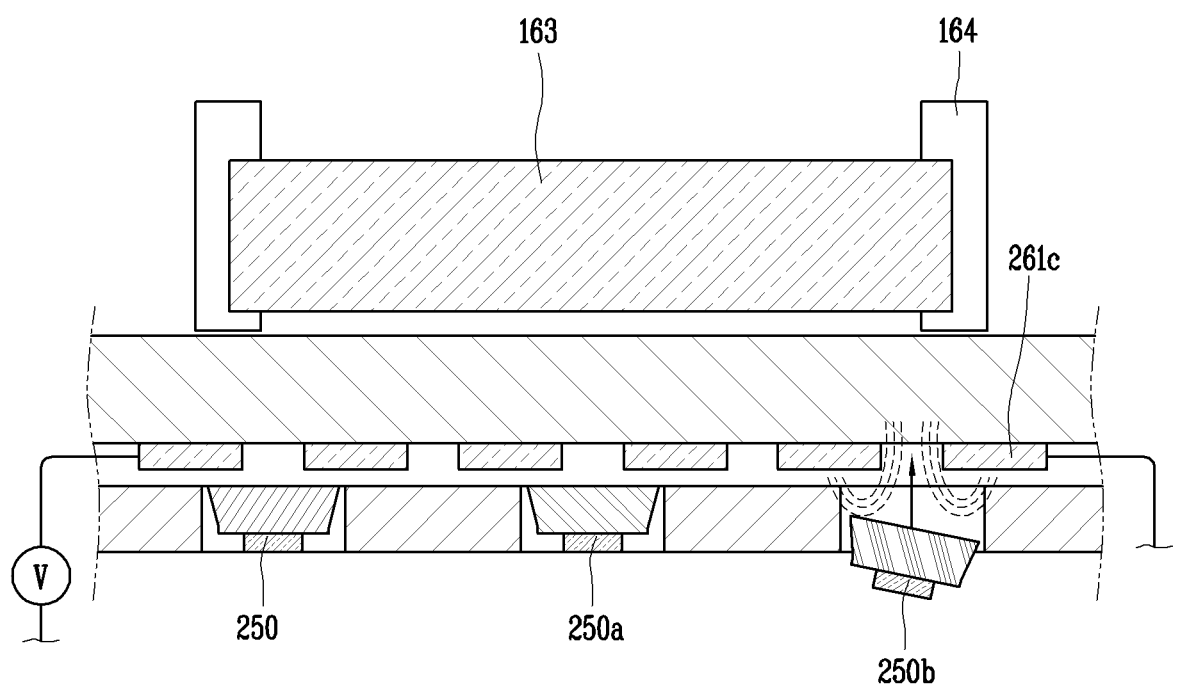

Then, the assembly process described with reference to 8A through 8E are carried out using the green semiconductor light emitting device 250a and the red semiconductor light emitting device 250b, respectively (FIGS. 8F and 8G). However, since the wiring substrate 261 is already loaded at the assembly position, the process of loading the substrate into the assembly position can be omitted.

Then, the process of unloading the wiring substrate 261 is carried out, and the assembly process is completed.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

Furthermore, the blue semiconductor light emitting device, the green semiconductor light emitting device, and the red semiconductor light emitting device can be assembled at desired positions, respectively.

As described above, according to the present disclosure having the foregoing configuration, a large number of semiconductor light emitting devices can be assembled at one time in a display device in which individual pixels are formed with semiconductor light emitting devices.

When the assembly process is completed as described above, a process of fabricating a display device can be carried out. Hereinafter, a fabrication process of such a display device will be described in detail with reference to the drawings.

FIGS. 9A through 9E are views showing a process of fabricating a display device after self-assembling semiconductor light emitting devices on a wiring substrate using the self-assembly device in FIG. 6.

Figure 9A:
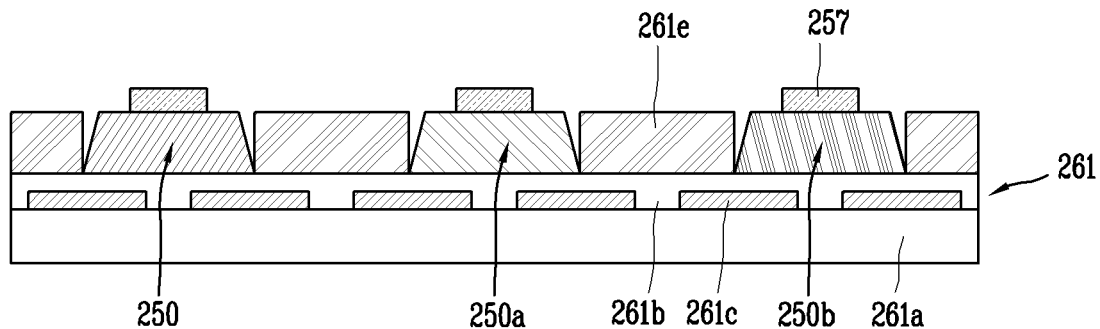
FIGS. 9A through 9E are views showing a process of fabricating a display device after self-assembling semiconductor light emitting devices on a wiring substrate using the self-assembly device in FIG. 6.
Figure 9B:
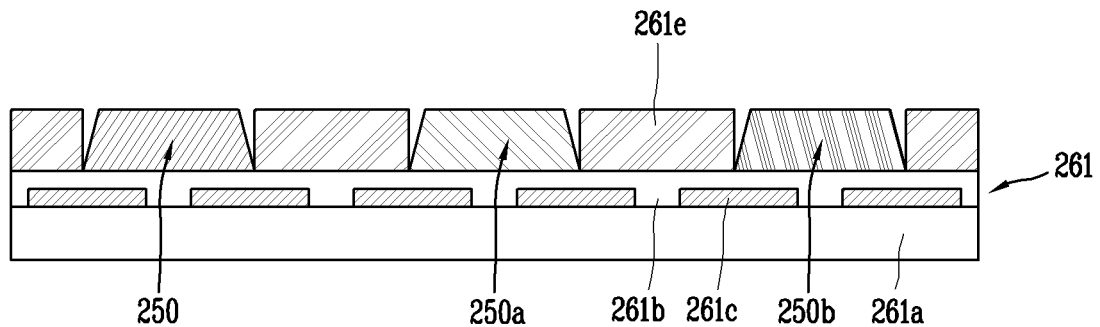

The movement of the semiconductor light emitting devices in the fluid chamber are guided, and the semiconductor light emitting devices are assembled at preset positions of the substrate by the foregoing process, and then the magnetic bodies 257 of the semiconductor light emitting device are removed while the semiconductor light emitting devices 250, 250a, 250b are assembled at the preset positions of the substrate 261 (FIGS. 9A and 9B).

While the blue semiconductor light emitting device 250, the green semiconductor light emitting device 250a, and the red semiconductor light emitting device 250b are sequentially arranged along one direction as shown in FIG. 9A, the magnetic bodies 257 provided in the blue semiconductor light emitting device 250, the green semiconductor light emitting device 250a, and the red semiconductor light emitting device 250b are removed as shown in FIG. 9B.

The removal of the magnetic body 257 can be carried out by a chemical or physical method, and through this, the second conductive electrode 256 (see FIG. 5B) can be exposed to an outside of the cell. On the other hand, the semiconductor light emitting device can have a structure in which a magnetic body is protruded from the second conductive semiconductor layer 255 (see FIG. 5B) without the second conductive electrode 256, and in this case, the second conductive semiconductor layer 255) can be exposed to an outside of the cell.

Figure 9C:
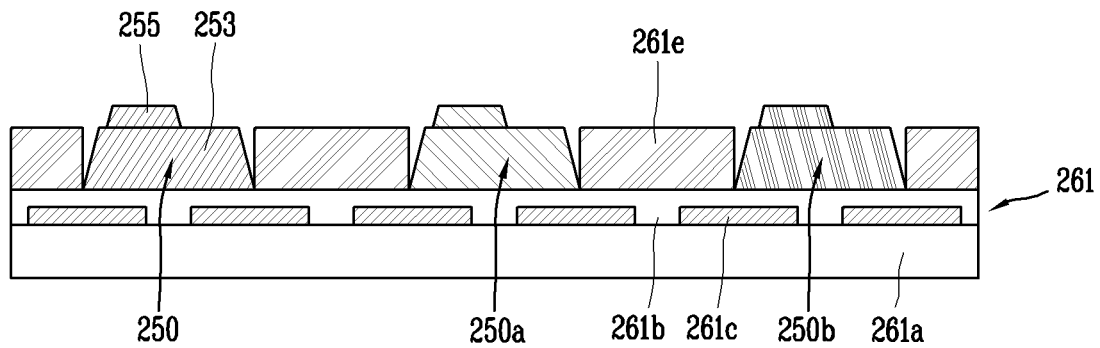

Next, a mesa formation process can be carried out while the semiconductor light emitting devices are assembled at preset positions of the substrate (FIG. 9C).

For example, in order to generate the plurality of semiconductor light emitting devices, at least one of the first conductive semiconductor layer 253 and the second conductive semiconductor layer 255 is etched while the semiconductor devices are assembled at preset positions of the substrate.

More specifically, the second conductive semiconductor layer 255 facing an outside of the cell is etched., and in this case, the second conductive electrode 256 and the active layer 255 (hereinafter, see FIG. 5B) can also be etched together. For another example, in the case where a magnetic body is directly formed on one surface of the conductive semiconductor layer without the second conductive electrode 256, the magnetic body can be protruded from one surface of the semiconductor layer to be etched between the first conductive semiconductor layer 253 and the second conductive semiconductor layer 255.

Part of a surface opposite to a surface in contact with the dielectric layer on the first conductive semiconductor layer 253 can be exposed to the outside through etching. A portion exposed to the outside need not be overlapped with an upper surface of the second conductive semiconductor layer 255, and can be a portion spaced apart in a horizontal direction. By such a mesa process, a flip-chip type semiconductor light emitting device is formed.

Figure 9D:
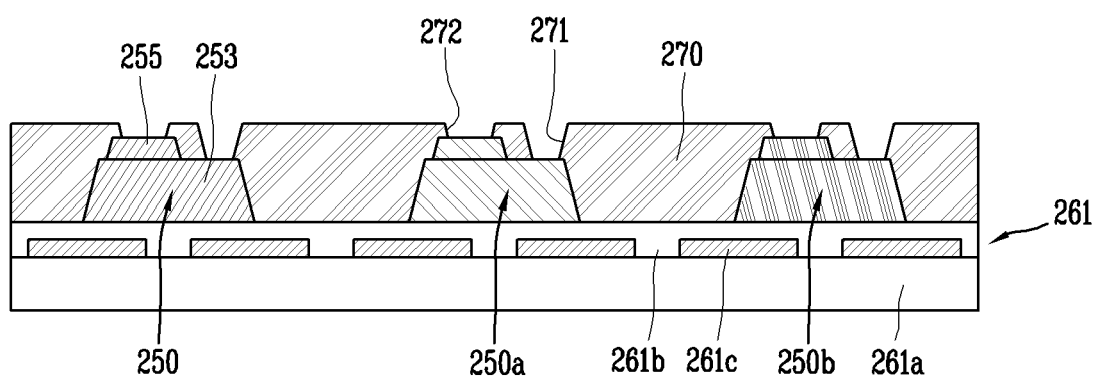

Next, the process of forming a passivation layer, performing planarization, and forming a contact hole is carried out (FIG. 9D).

According to the illustration, a passivation layer 270 can be filled between the plurality of semiconductor light emitting devices. More specifically, as described above, the wiring substrate 261 includes a plurality of cells 261d partitioned by partition walls, and a gap exists between the cell and the semiconductor light emitting device. The passivation layer 270 fills the gap while covering the semiconductor light emitting device together with the partition walls.

Through such a process, a structure in which the passivation layer 270 surrounds the semiconductor light emitting device can be formed on the display. In this case, the passivation layer 270 can be made of a polymer material so as to be integrated with the partition walls.

In the display device shown in FIG. 9D implemented by the above process, the passivation layer 270 can include a plurality of cells, and the plurality of semiconductor light emitting devices can be accommodated in the cells. In other words, the cells that have been provided in the self-assembly process in the final structure are changed into the internal spaces of the passivation layer 270. In this case, an electric field generated by the pair electrodes 261c described with reference to FIG. 9D as described above can be formed inside the cells. In addition, the plurality of cells are arranged in a matrix structure, and the plurality of the pair electrodes 261c have a structure extended to neighboring cells.

Then, a planarization process is carried out to planarize a top surface of the passivation layer 270, and contact holes 271, 272 for wiring lines can be formed. The contact holes 271, 272 can be formed in the first conductive semiconductor layer 253 and the second conductive semiconductor layer 255, respectively.

Figure 9E:
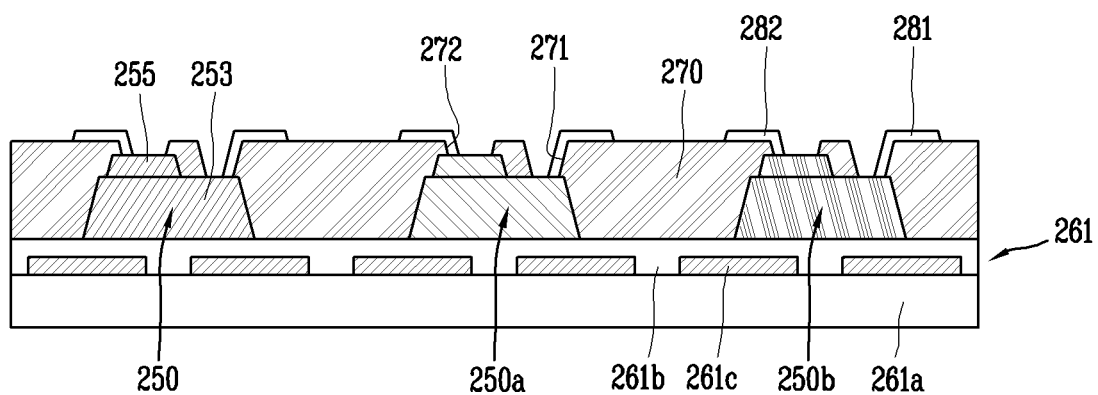

Finally, the first wiring electrodes and the second wiring electrodes are connected to the plurality of semiconductor light emitting devices through the contact holes (FIG. 9E).

According to the illustration of FIG. 9E, the first wiring electrode 281 and the second wiring electrode 282 can be extended to one surface of the passivation layer 270. At this time, one surface of the passivation layer 270 can be a surface opposite to a surface covering the dielectric layer 261b. For example, the first wiring electrode 281 is extended to an upper surface of the passivation layer 270 on the first conductive semiconductor layer 253 through a first contact hole 271 formed on the first conductive semiconductor layer 253. The second wiring electrode 282 is extended to an upper surface of the passivation layer 270 through a second contact hole 272 formed on the second conductive semiconductor layer 255. However, for another example, when the second conductive electrode 256 (see FIG. 5D) is present on an upper surface of the second conductive semiconductor layer 255, the second wiring electrode 282 can be extended to an upper surface of the passivation layer 270 through the second contact hole 272.

According to such a structure, although transfer is carried out by self-assembly, the wiring lines of the flip-chip type semiconductor light emitting devices can be implemented. In this case, the passivation layer 270 can be disposed on a front side of the display device 100 (see FIG. 1), and at this time, the first wiring electrode 281 and the second wiring electrode 282 can be transparent electrodes. At this time, the pair electrode 261c made of a metal material can be used as a reflective layer.

For another example, the passivation layer 270 can be disposed on a rear side of the display device 100, and at this time, the dielectric layer 261b and the base portion 261a of the substrate 261 are formed of a transparent material.

On the other hand, as described with reference to FIGS. 8A through 8G, in the self-assembly method described above, the semiconductor light emitting devices that emit light of different colors can be sequentially disposed on the substrate. In order to arrange the semiconductor light emitting devices that emit light of different colors on a single substrate, the number of self-assembly processes must be equal to that of the types of semiconductor light emitting devices. For example, at least three self-assembly processes are required to arrange the semiconductor light emitting devices that emit blue, red, and green on a single substrate.

On the other hand, in order to apply electric power to the pair electrodes disposed on the substrate during self-assembly, an external power source must be connected to the pair electrodes. An electrode (hereinafter, a bus electrode) for connecting the pair electrodes to the external power source is disposed at an edge of the substrate. Since the bus electrode is not an electrode used for driving a display, it is removed from the fabrication process subsequent to self-assembly.

The present disclosure provides a method for minimizing a time of the self-assembly process. Specifically, the present disclosure provides a method of minimizing a time required for arranging semiconductor light emitting devices that emit blue, red, and green on a single substrate. Furthermore, the present disclosure provides a method for minimizing a process time for connecting the pair electrodes and the bus electrode and a process time for removing the bus electrodes.

To this end, a substrate used for the method of fabricating a display device according to the present disclosure includes an assembly region and a non-assembly region. The assembly region denotes a region where the semiconductor light emitting device are arranged during self-assembly. A plurality of pair electrodes are arranged in the assembly region, and the semiconductor light emitting devices are arranged to overlap with any one of the pair electrodes during self-assembly.

On the other hand, the non-assembly region denotes a region where the semiconductor light emitting devices are not arranged during self-assembly. The non-assembly region can be a region that can be removed during a display fabrication process, and need not exist in the completed display device. However, the present disclosure is not limited thereto, and at least part of the non-assembly region need not be removed from the display fabrication process, but can remain. A plurality of bus electrodes electrically connected to the pair electrodes can be arranged in the non-assembly region.

The bus electrodes are electrically connected to the external power source during self-assembly to apply a voltage to the pair electrodes through the external power source.

At least two bus electrodes can be arranged in the non-assembly region. Either one of the two bus electrodes is connected to a first electrode of the pair electrode and the other one is connected to a second electrode of the pair electrode. On the two bus electrodes, when power is applied to the pair electrodes, the first and second electrodes have different polarities. In this specification, two bus electrodes applied to the pair electrodes are described as one type of bus electrode. For example, when two types of bus electrodes in the non-assembly region are arranged, both the two bus electrodes connected to the first and second electrodes of a pair electrode are referred to as first bus electrodes, and both the two bus electrodes connected to the first and second electrodes of another pair electrode are referred to as second bus electrodes. Furthermore, in this specification, a bus electrode being connected to a pair electrode, which means denotes that each of the two bus electrodes is electrically connected to each of the first and second electrodes of the pair electrode.

The non-assembly region can be formed at an edge of the assembly region. The plurality of pair electrodes are arranged in parallel along one direction in the assembly region, and the bus electrodes arranged in the non-assembly region are electrically connected to the pair electrodes at an edge of the assembly region.

On the other hand, a plurality of the assembly regions can be formed on a single substrate. The assembly regions spaced apart from each other are used as substrates for different display devices. The pair electrodes arranged in different assembly regions can be electrically connected to the same bus electrode. For example, a bus electrode connected to the first electrode included in the pair electrode and a bus electrode connected to the second electrode included in the pair electrode can be arranged in the non-assembly region. The pair electrodes arranged in each of the plurality of assembly regions can be electrically connected to the two bus electrodes.

During the self-assembly process, when a voltage is applied between the two bus electrodes, an electric field is generated from the pair electrodes disposed in each of the plurality of assembly regions. Accordingly, the semiconductor light emitting devices are arranged in each of the plurality of assembly regions during the self-assembly process. As described above, it can be possible to fabricate a plurality of display devices through one self-assembly process.

Hereinafter, a method of sequentially self-assembling blue, red, and green semiconductor light emitting devices will be described in more detail.

Figure 10:
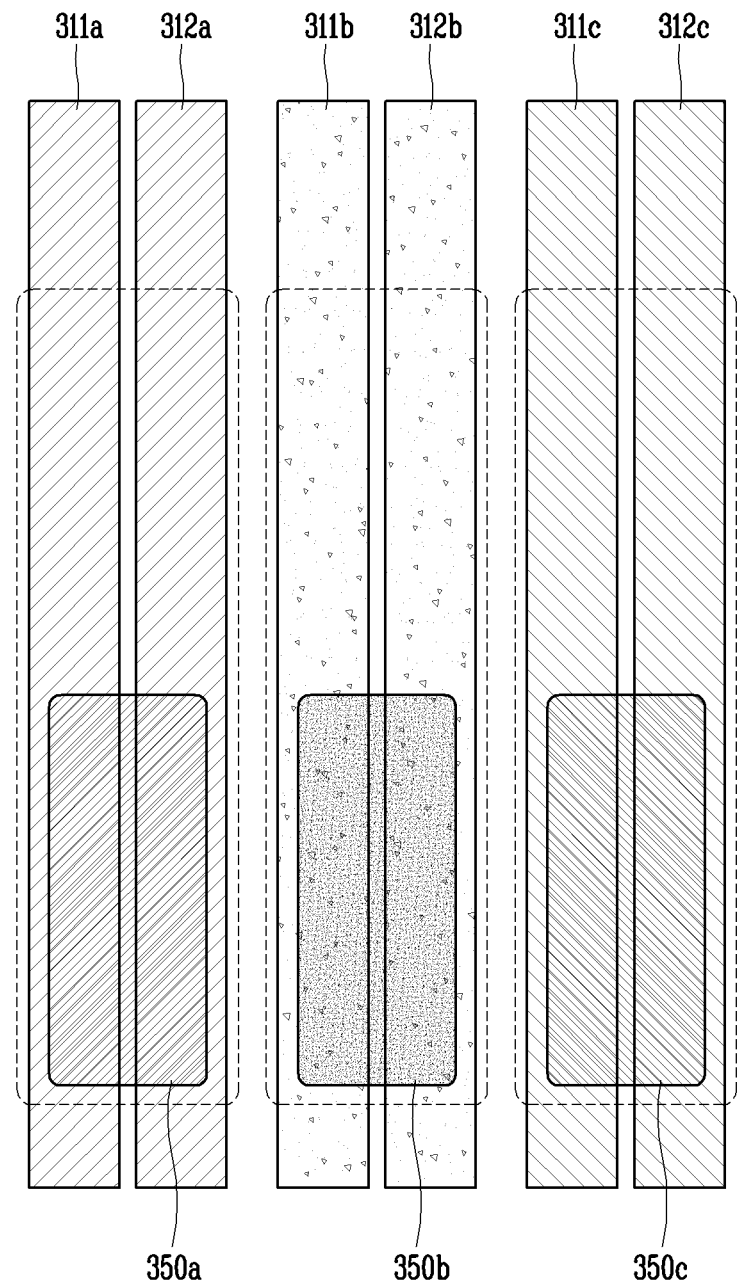
FIG. 10 is a view showing pair electrodes arranged on a substrate.
Figure 11:
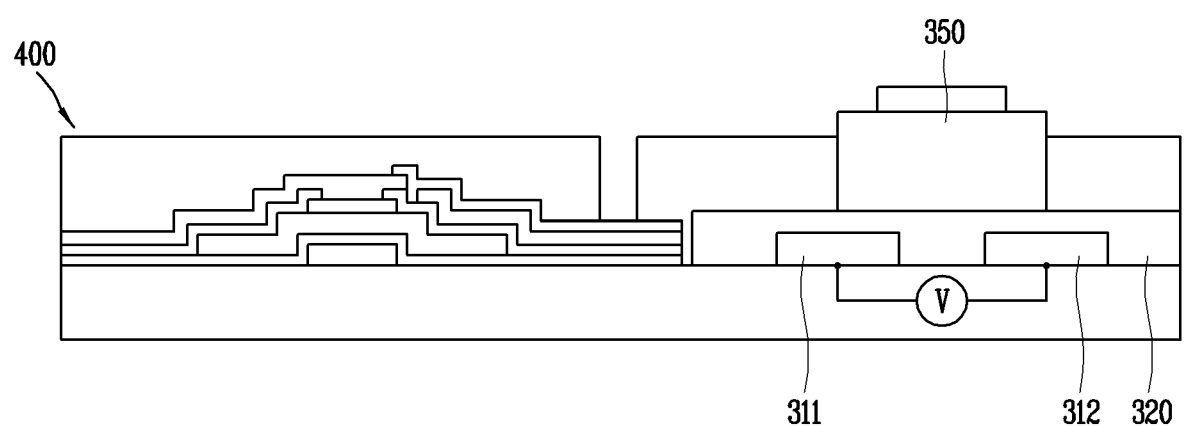
FIG. 11 is a cross-sectional view of a display device including a thin film transistor.
Figure 12:
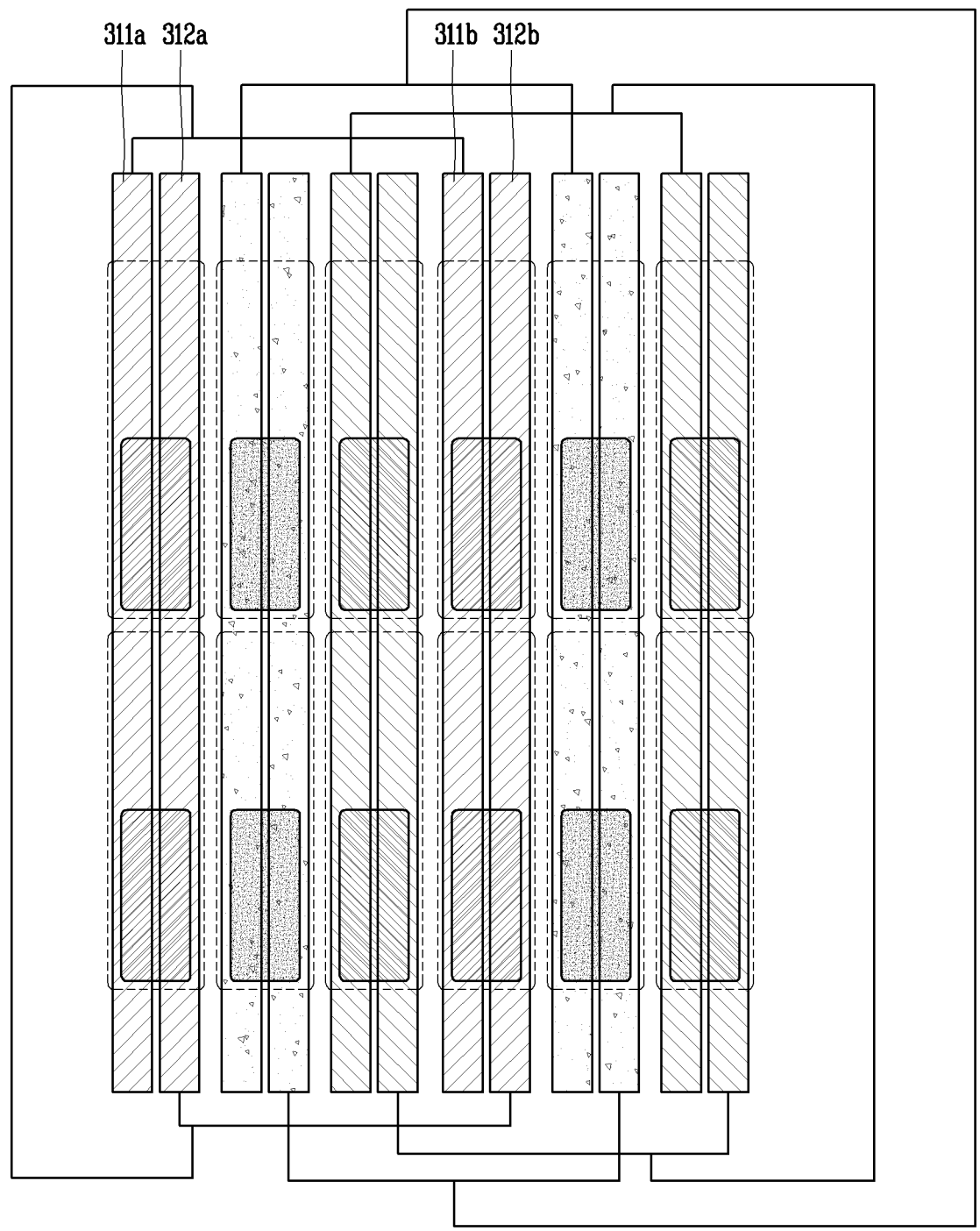
FIG. 12 is a view showing a substrate including a plurality of assembly regions.

FIG. 10 is a view showing pair electrodes arranged on a substrate, and FIG. 11 is a cross-sectional view of a display device including a thin film transistor, and FIG. 12 is a view showing a substrate including a plurality of assembly regions.

The processes of applying a magnetic force to the semiconductor light emitting devices and guiding the semiconductor light emitting devices to the preset positions are carried out at least once while the semiconductor light emitting devices that emit blue light are put into the fluid chamber, and carried out at least once while the semiconductor light emitting devices that emit red light are put into the fluid chamber, and carried out at least once while the semiconductor light devices that emit green light are put into the fluid chamber. Here, the order of blue, red, and green is not particularly limited.

Here, the pair electrode to which the voltage is applied is changed according to the type of the semiconductor light emitting devices being put into the fluid chamber. Specifically, referring to FIG. 10, a plurality of pair electrodes are divided into three groups. Hereinafter, the plurality of pair electrodes are divided into first through third groups. The blue semiconductor light emitting devices overlap with any one of the pair electrodes belonging to the first group during self-assembly. The red semiconductor light emitting devices overlap with any one of the pair electrodes belonging to the second group. The green semiconductor light emitting devices overlap with any one of the pair electrodes belonging to the second group. FIG. 11 shows that a thin film transistors 400 may be arranged on the same plane as the pair electrodes 311, 312, while the pair electrodes 311, 312 being covered by a dielectric layer 320, and a semiconductor light emitting device 350 arranged over the pair electrodes 311, 312. In embodiments, adjacent pair of the plurality of pair electrodes 311a, 312a are separated by a gap, and the plurality of semiconductor light emitting devices 350a are arranged directly over the gap.

A voltage must be applied to the pair electrode belonging to the first group when self-assembly is carried out while the blue semiconductor light emitting devices are put into the fluid chamber, and a voltage must be applied to the pair electrode belonging to the second group when self-assembly is carried out while the red semiconductor light emitting devices are put into the fluid chamber, and a voltage must be applied to the pair electrode belonging to the third group when self-assembly is carried out while the green semiconductor light emitting devices are put into the fluid chamber. The plurality of pair electrodes provide magnetic force to arrange the plurality of semiconductor light emitting devices on the substrate, and do not provide the electric signal to generate an image of the display device. Widths of the plurality of pair electrodes are greater than widths of the first and second wiring electrodes. The plurality of semiconductor light emitting devices are arranged on the dielectric layer, and the first wiring electrode and the second wiring electrode are arranged on the each of the plurality of semiconductor light emitting devices so that the dielectric layer is interposed between the plurality of semiconductor light emitting devices and the plurality of pair electrodes, and the plurality of semiconductor light emitting devices are interposed between the first and second wiring electrodes and the dielectric layer.

However, it is not necessary that a voltage is applied to only the pair electrodes of a group corresponding to specific semiconductor light emitting devices while the specific semiconductor light emitting devices are put into the fluid chamber.

For example, a method of self-assembling blue, red, and green semiconductor light emitting devices in order will be described as an example. When self-assembly is carried out while the red semiconductor light emitting devices are put into the fluid chamber, the blue semiconductor light emitting devices are already coupled to the substrate. At this time, when a voltage applied to the pair electrodes belonging to the first group is cut off, the blue semiconductor light emitting devices can be released from the substrate. In order to prevent this, when self-assembly is carried out while the red semiconductor light emitting devices are put into the fluid chamber, a voltage must be applied to both the first and second groups. In this case, an attractive force can be applied between the pair electrodes belonging to the first group and the red semiconductor light emitting devices, but since the blue semiconductor light emitting devices are already arranged at preset positions, the red semiconductor light emitting devices are not arranged to overlap with the pair electrodes belonging to the first group.

Meanwhile, when the green semiconductor light emitting devices are self-assembled, voltages must be applied to the first through third groups while the green semiconductor light emitting devices are put into the fluid chamber.

As described above, according to the present disclosure, voltages are applied to different pair electrodes according to the type of semiconductor light emitting devices being put into a fluid chamber so that the semiconductor light emitting devices are guided to different pair electrodes according to the type of the semiconductor light emitting devices being put into the fluid chamber.

Figure 13:
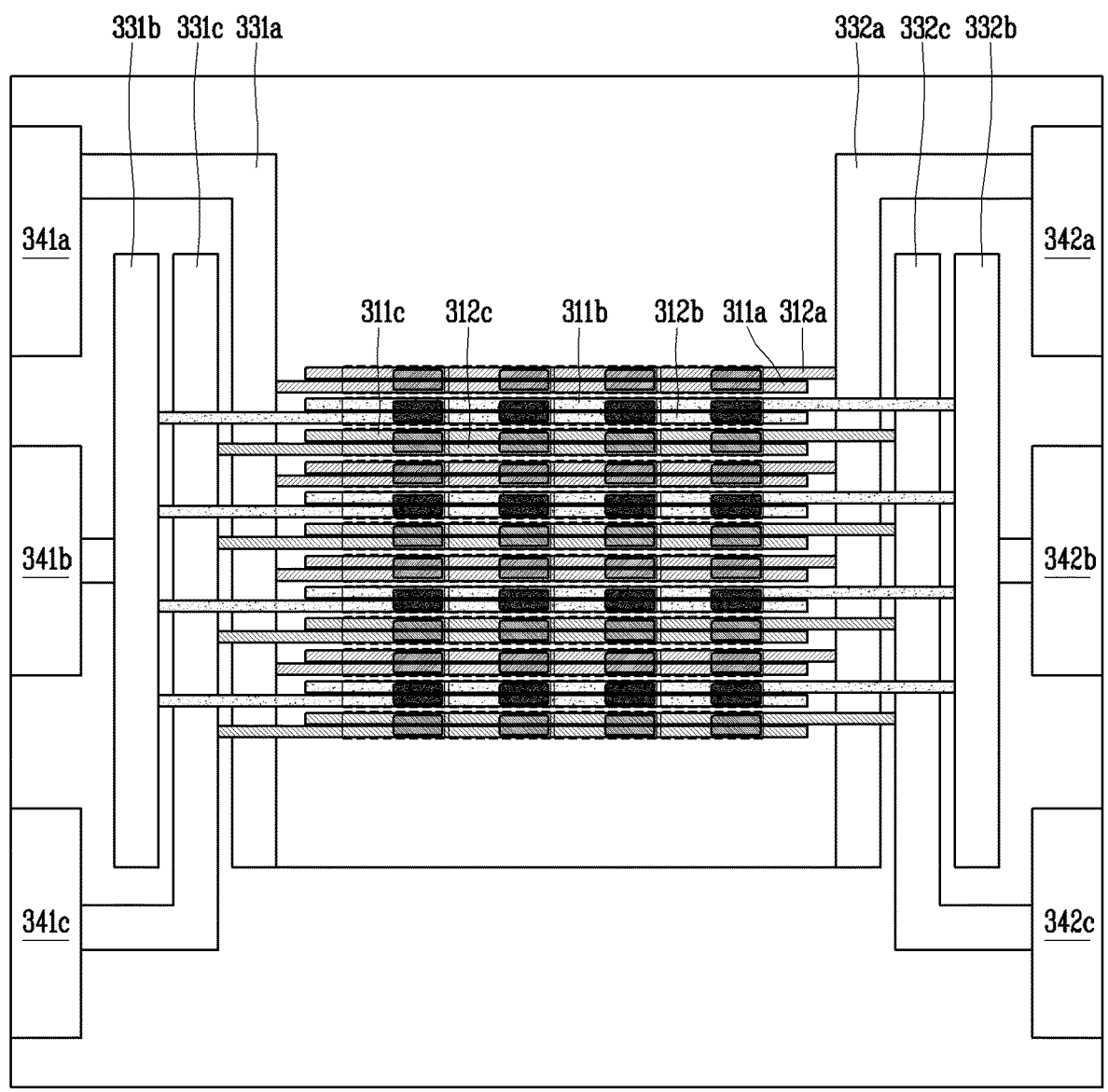
FIG. 13 is a view showing the arrangement of semiconductor light emitting devices and pair electrodes included in a display device according to the present disclosure.
Figure 14:
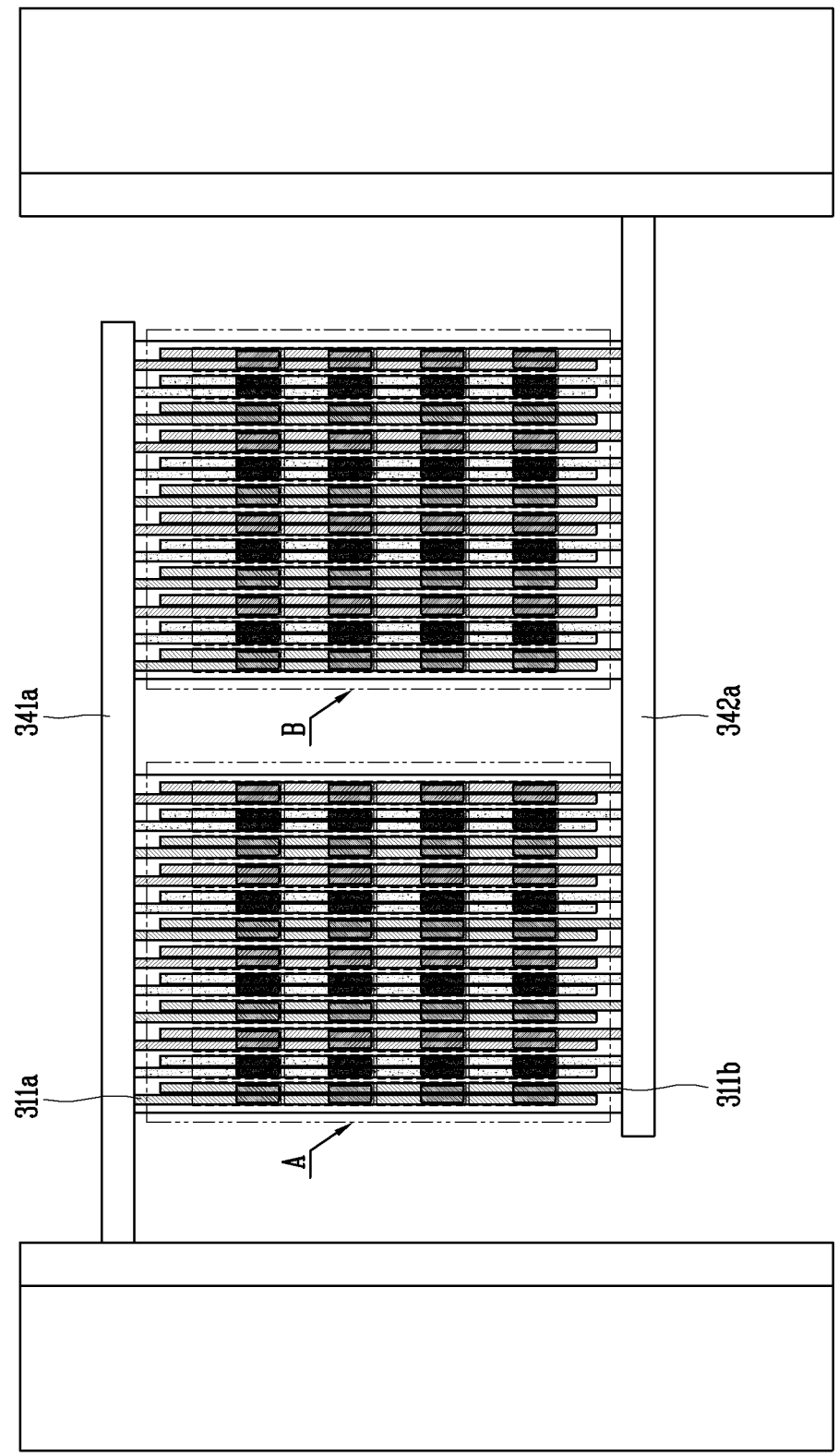
FIG. 14 is a view showing a state in which pairs of electrodes and bus electrodes are connected.

To this end, referring to FIGS. 12-14, electrically isolated first through third bus electrodes can be arranged in a non-assembly region of the substrate according to the present disclosure. Furthermore, an assembly region can be formed on the substrate, and the pair electrodes arranged in the assembly region are classified into first through third groups. The first bus electrodes 331a, 332a are connected to the pair electrodes 311a, 312a belonging to the first group and the second bus electrodes 331b, 332b are connected to the pair electrodes 311b, 312b belonging to the second group, and the third bus electrodes 331c, 332c are connected to the pair electrodes 311c, 312c belonging to the third group. The bus electrodes are connected to different external power sources 341a, 341b, 341c, 342a, 342b, 342c. Through the above-described structure, the present disclosure can selectively apply voltages to the pair electrodes. In embodiments, the pair electrodes 311a, 312a, 311b, 312b, 311c, 312c correspond to the plurality of electrodes 261c.

On the other hand, a plurality of assembly regions can be formed on the substrate. Referring to FIG. 12, three groups of pair electrodes can be arranged in each of the assembly regions (A and B in FIG. 14) formed on the substrate. Here, the pair electrodes belonging to the same group are electrically connected to the same bus electrode. For example, the first group of the pair electrodes 311a, 311b arranged in the first assembly region (A) and the first group of the pair electrodes 311a, 311b arranged in the second assembly region (B) are electrically connected to the same bus electrodes.

As described above, according to the present disclosure, voltages can be applied to a plurality of assembly regions at one time. Through this, the present disclosure can fabricate a plurality of display devices including blue, red, and green semiconductor light emitting devices using only three self-assembly processes. Furthermore, according to the present disclosure, since a plurality of display devices can be fabricated using only one set of bus electrodes, it can be possible to reduce a time for connecting the pair electrode and the bus electrode and a time for removing the bus electrode.

Meanwhile, the present disclosure can further include removing the non-assembly region after the self-assembly process is completed. When the substrate includes a plurality of assembly regions, the plurality of assembly regions can be separated from each other during the process of removing the non-assembly region. The separated assembly regions are fabricated into different display devices.

As a result, a plurality of pairs of electrodes can remain in the assembly region. Hereinafter, a display device fabricated by the fabrication method according to the present disclosure will be described.

FIG. 13 is a view showing the arrangement of semiconductor light emitting devices and pair electrodes included in a display device according to the present disclosure, and FIG. 14 is a view showing a state in which pairs of electrodes and bus electrodes are connected.

According to the foregoing fabrication method, a display device according to the present disclosure can include a substrate, a plurality of semiconductor light emitting devices arranged on the substrate, a first wiring electrode and a second wiring electrode extended from the semiconductor light emitting devices, respectively, to supply an electric signal to the semiconductor light emitting devices, a plurality of pair electrodes arranged on the substrate to generate an electric field when an electric current is supplied, and provided with first and second electrodes formed on an opposite side to the first and second wiring electrodes with respect to the semiconductor light emitting devices, and a dielectric layer formed to cover the pair electrodes. Here, the plurality of pair electrodes can be arranged in parallel to each other along one direction.

Since the semiconductor light emitting device is guided by an electric field formed between the first electrode and the second electrode included in the pair electrode during self-assembly, each of a plurality of semiconductor light emitting devices can be disposed to overlap with any one of the pair electrodes.

On the other hand, when semiconductor light emitting devices that emit different colors are self-assembled, the semiconductor light emitting devices that emit different colors overlap with different pair electrodes. Specifically, when the semiconductor light emitting devices include a first semiconductor light emitting device that emits first color and a second semiconductor light emitting device that emits second color different from the first color, each of the first and second semiconductor light emitting devices is disposed to overlap with a different pair electrode.

According to an embodiment, referring to FIG. 13, in the case of a display device including a blue semiconductor light emitting device 350a, a red semiconductor light emitting device 350b, and a green semiconductor light emitting device 350c, the blue semiconductor light emitting device 350a overlaps with a first pair electrode 311a, 312a, and the red semiconductor light emitting device 350b overlaps with a second pair electrodes 311b, 312b, and the green semiconductor light emitting device 350c overlaps with a third pair electrodes 311c, 312c.

This is because a voltage is applied to a different pair electrode depending on the type of the semiconductor light emitting device being put into the fluid chamber.

On the other hand, a distance between the first and second electrodes included in each of the pair electrodes can be disposed to be smaller than that between the pair electrodes. Voltages can be applied to adjoining pair electrodes during self-assembly, and in this case, an electric field can also be formed between the pair electrodes. Due to this, the semiconductor light emitting device can be guided between the pair electrodes. In the present disclosure, the intensity of an electric field formed between the first and second electrodes is greater than that of a magnetic field formed between the pair electrodes, thereby preventing the semiconductor light emitting device from being guided between the pair electrodes.

On the other hand, a width of each of the pair electrodes can be greater than that of the semiconductor light emitting device. This is to ensure that the semiconductor light emitting device is disposed accurately between the first and second electrodes.

Meanwhile, a display device according to the present disclosure can be implemented in an active matrix manner. To this end, a thin film transistor can be used, and the thin film transistor can be transferred to a substrate prior to the self-assembly of the semiconductor light emitting device. Therefore, as shown in FIG. 14, pairs of electrodes 311a, 311b and bus electrodes 331a, 332a are connected.

According to the process and device of the present disclosure described above, a large number of semiconductor light emitting devices can be pixelated on a wafer having a small size, and then directly transferred onto a large-area substrate. Through this, it can be possible to fabricate a large-area display device at a low cost.

What is the claimed is:

1. A display device, comprising:
   a substrate having an assembly region and a non-assembly region;
   a plurality of semiconductor light emitting devices arranged on the substrate;
   a first wiring electrode and a second wiring electrode extended from each of the plurality of semiconductor light emitting devices, respectively, to supply an electric signal to the plurality of semiconductor light emitting devices;
   a plurality of pair electrodes arranged on the substrate to generate an electric field when an electric current is supplied, and provided with first and second pair electrodes disposed on an opposite side to the first and second wiring electrodes with respect to the plurality of semiconductor light emitting devices;
   a dielectric layer disposed on the plurality of pair electrodes; and
   a plurality of bus electrodes electrically connected to the plurality of pair electrodes,
   wherein the plurality of pair electrodes are arranged in parallel to each other along a direction in the assembly region, and
   wherein the bus electrodes are disposed in the non-assembly region.

2. The display device of claim 1, wherein the bus electrodes comprise electrically isolated first, second and third bus electrodes arranged in the non-assembly region of the substrate.

3. The display device of claim 2, wherein the plurality of pair electrodes arranged in the assembly region are classified into first through third groups, and the first bus electrodes are connected to a first group pair electrodes, the second bus electrodes are connected to a second group pair electrodes, and the third bus electrodes are connected to a third group pair electrodes.

4. The display device of claim 1, wherein the bus electrodes are connected to different external power sources respectively.

5. The display device of claim 1, wherein the substrate comprises a plurality of assembly regions, and
wherein voltages are applied to the plurality of assembly regions at one time.

6. The display device of claim 1, wherein widths of the plurality of pair electrodes are greater than widths of the first and second wiring electrodes.

7. The display device of claim 1, wherein adjacent pair of the plurality of pair electrodes are separated by a gap, and the plurality of semiconductor light emitting devices are arranged directly over the gap.

8. The display device of claim 1, wherein a distance between adjacent first and second electrodes is smaller than that between adjacent pair electrodes.

9. The display device of claim 1, wherein the plurality of semiconductor light emitting devices are arranged on the dielectric layer, and the first wiring electrode and the second wiring electrode are arranged on the each of the plurality of semiconductor light emitting devices so that the dielectric layer is interposed between the plurality of semiconductor light emitting devices and the plurality of pair electrodes, and the plurality of semiconductor light emitting devices are interposed between the first and second wiring electrodes and the dielectric layer.

10. The display device of claim 1, wherein a width of each of the pair electrodes is larger than that of each semiconductor light emitting device.

11. A display device, comprising:
a substrate;
a plurality of semiconductor light emitting devices arranged on the substrate;
a first wiring electrode and a second wiring electrode extended from each of the plurality of semiconductor light emitting devices, respectively, to supply an electric signal to the plurality of semiconductor light emitting devices;
a plurality of pair electrodes arranged on the substrate to generate an electric field when an electric current is supplied, and provided with first and second pair electrodes disposed on an opposite side to the first and second wiring electrodes with respect to the plurality of semiconductor light emitting devices; and
a dielectric layer disposed on the plurality of pair electrodes,
wherein the plurality of pair electrodes are arranged in parallel to each other along a direction.

12. The display device of claim 11, wherein each of the plurality of semiconductor light emitting devices is disposed to overlap with any one of the plurality of pair electrodes.

13. The display device of claim 12, wherein the plurality of semiconductor light emitting devices comprise:
a first semiconductor light emitting device that emits a first color; and
a second semiconductor light emitting device that emits a second color different from the first color,
wherein the first and second semiconductor light emitting devices are respectively disposed to overlap with different pair electrodes from each other.

14. The display device of claim 11, wherein a distance between adjacent first and second electrodes is smaller than that between adjacent pair electrodes.

15. The display device of claim 11, further comprising:
a thin film transistor disposed on the substrate, and electrically connected to one semiconductor light emitting device,
wherein the plurality of pair electrodes and the thin film transistor are disposed on the same plane of the substrate.

16. The display device of claim 11, wherein the plurality of semiconductor light emitting devices are arranged on the dielectric layer, and the first wiring electrode and the second wiring electrode are arranged on the each of the plurality of semiconductor light emitting devices so that the dielectric layer is interposed between the plurality of semiconductor light emitting devices and the plurality of pair electrodes, and the plurality of semiconductor light emitting devices are interposed between the first and second wiring electrodes and the dielectric layer.

17. The display device of claim 11, further comprising a plurality of bus electrodes electrically connected to the plurality of pair electrodes.

18. The display device of claim 17, wherein the plurality of pair electrodes are arranged in parallel to each other along a direction in the assembly region, and
wherein the bus electrodes are disposed in the non-assembly region.

19. The display device of claim 18, wherein the bus electrodes comprise electrically isolated first, second and third bus electrodes arranged in the non-assembly region of the substrate.

20. The display device of claim 19, wherein the plurality of pair electrodes arranged in the assembly region are classified into first through third groups, and the first bus electrodes are connected to a first group pair electrodes, the second bus electrodes are connected to a second group pair electrodes, and the third bus electrodes are connected to a third group pair electrodes.

* * * * *